United States Patent
Ruehle

(10) Patent No.: US 7,283,591 B2
(45) Date of Patent: Oct. 16, 2007

(54) PARALLELIZED DYNAMIC HUFFMAN DECODER

(75) Inventor: Michael D. Ruehle, San Diego, CA (US)

(73) Assignee: Tarari, Inc., San Diego, CA (US)

( * ) Notice: Subject to any disclaimer, the term of this patent is extended or adjusted under 35 U.S.C. 154(b) by 743 days.

(21) Appl. No.: 10/637,953

(22) Filed: Aug. 7, 2003

(65) Prior Publication Data
US 2004/0190635 A1  Sep. 30, 2004

Related U.S. Application Data

(60) Provisional application No. 60/459,233, filed on Mar. 28, 2003.

(51) Int. Cl.
*H04B 14/04* (2006.01)
(52) U.S. Cl. .................................. 375/253; 375/240.23
(58) Field of Classification Search ................ 375/253, 375/242, 240.23
See application file for complete search history.

(56) References Cited

U.S. PATENT DOCUMENTS

| | | | | |
|---|---|---|---|---|
| 3,891,804 | A | * | 6/1975 | Hachenburg ................. 370/475 |
| 4,383,316 | A | * | 5/1983 | Seidel ......................... 370/536 |
| 4,816,914 | A | * | 3/1989 | Ericsson ................ 375/240.03 |
| 4,916,660 | A | * | 4/1990 | Takahashi ................... 709/238 |
| 5,032,838 | A | | 7/1991 | Murayama et al. |
| 5,184,229 | A | * | 2/1993 | Saito et al. ................. 382/239 |
| 5,208,593 | A | * | 5/1993 | Tong et al. .................... 341/65 |
| 5,216,423 | A | * | 6/1993 | Mukherjee ..................... 341/79 |
| 5,245,338 | A | * | 9/1993 | Sun .............................. 341/67 |
| 5,309,156 | A | * | 5/1994 | Fujiyama ...................... 341/67 |
| 5,317,736 | A | * | 5/1994 | Bowen .................... 707/103 R |
| 5,528,628 | A | | 6/1996 | Park et al. |
| 5,592,297 | A | * | 1/1997 | Van Dorsselaer ........... 382/245 |
| 5,617,089 | A | * | 4/1997 | Kinouchi et al. ............. 341/65 |
| 5,742,930 | A | * | 4/1998 | Howitt ....................... 704/502 |
| 5,751,232 | A | * | 5/1998 | Inoue et al. .................. 341/63 |
| 5,757,295 | A | | 5/1998 | Bakhmutsky |
| 5,798,719 | A | | 8/1998 | Wise et al. |
| 5,841,380 | A | | 11/1998 | Sita et al. |
| 5,870,497 | A | * | 2/1999 | Galbi et al. ................. 382/232 |

(Continued)

FOREIGN PATENT DOCUMENTS

JP  05252055 A  * 9/1993

OTHER PUBLICATIONS

Patel, A., Maximal q-nary linear codes with large minimum distance (Corresp.), Information Theory, IEEE Transactions on, vol. 21, Issue 1, Jan. 1975 pp. 106-110.*

*Primary Examiner*—Mohammed Ghayour
*Assistant Examiner*—Juan Alberto Torres
(74) *Attorney, Agent, or Firm*—Knobbe Martens Olson & Bear LLP

(57) ABSTRACT

Several code detectors in parallel simultaneously examine varying overlapping segments of a data stream containing variable length codes, referred to as a data window. The data window segments directly address memory structures within each of the code detectors without any previous logic stages. Each code detector is responsible for a range of code lengths, and ignores data window bits that are not relevant to its code length range. Each code detector outputs a possible result to a layer of logic that selects the possible result of the single code detector which contains result data corresponding to a variable length code in the data window.

33 Claims, 9 Drawing Sheets

U.S. PATENT DOCUMENTS

| | | | |
|---|---|---|---|
| 6,020,835 A * | 2/2000 | Hasegawa | 341/67 |
| 6,043,765 A | 3/2000 | Twardowski | |
| 6,185,339 B1 * | 2/2001 | Ozaki | 382/232 |
| 6,304,197 B1 | 10/2001 | Freking et al. | |
| 6,477,204 B1 * | 11/2002 | Fukushima et al. | 375/240.28 |
| 6,496,971 B1 * | 12/2002 | Lesea et al. | 716/16 |
| 6,504,496 B1 * | 1/2003 | Mesarovic et al. | 341/106 |
| 2001/0054973 A1 * | 12/2001 | Kobayashi | 341/67 |
| 2002/0090142 A1 * | 7/2002 | Igarashi et al. | 382/246 |
| 2002/0157058 A1 * | 10/2002 | Ariel et al. | 714/774 |
| 2003/0003937 A1 * | 1/2003 | Ohkubo et al. | 455/517 |
| 2003/0048956 A1 * | 3/2003 | Mitchell et al. | 382/250 |
| 2003/0137697 A1 * | 7/2003 | Sato et al. | 358/2.1 |
| 2004/0042675 A1 * | 3/2004 | Kobayashi | 382/245 |
| 2005/0052295 A1 * | 3/2005 | Bossen | 341/107 |
| 2005/0232364 A1 * | 10/2005 | Kuroda et al. | 375/240.25 |

* cited by examiner

PARALLELIZED DYNAMIC HUFFMAN DECODER

PRIORITY DATA

This application claims priority under 35 U.S.C. § 119(e) from Provisional Patent Application No. 60/459,233, filed on Mar. 28, 2003 and entitled "Parallelized Dynamic Huffman Decoder", which is hereby incorporated by reference.

BACKGROUND OF THE INVENTION

1. Field of the Invention

The invention relates to decoding of variable-length codes (VLC), such as Huffman codes. More particularly, the invention relates to the use of multiple decoders to decode VLC codes.

2. Description of the Related Art

For electronic data storage and transmission, text or other strings of symbols are commonly represented by binary codes. One example of such a code is the ASCII representation of letters, numbers and other characters as 8-bit binary codes, or bytes. As another example, the four letters A, B, C and D may be represented with two-bit codes, such as:

| Code 1 | |
|---|---|
| Symbol | Binary Code |
| A | 00 |
| B | 01 |
| C | 10 |
| D | 11 |

Thus, the 8-symbol message "ABACBAAD" may be represented using Code 1 in a 16 bit string as follows:

| A | B | A | C | B | A | A | D |
|---|---|---|---|---|---|---|---|
| 00 | 01 | 00 | 10 | 01 | 00 | 00 | 11 |

One of the objectives of data compression is to represent data using as few bits as possible. One common method of reducing the number of bits is to use binary codes of different lengths to represent different symbols. Compression can be achieved if shorter codes are used for symbols that occur more often, and longer codes for symbols that occur less often. For example, the message "ABACBAAD" uses A more often than B, and B more often than C or D. Thus, the message can be compressed if we use a variable-length code, such as the following:

| Code 2 | |
|---|---|
| Symbol | Binary Code |
| A | 0 |
| B | 10 |
| C | 110 |
| D | 111 |

Using Code 2, the same 8-symbol message "ABACBAAD," which was represented with 16 bits using Code 1, is represented with only 14 bits using Code 2 as follows:

| A | B | A | C | B | A | A | D |
|---|---|---|---|---|---|---|---|
| 0 | 10 | 0 | 110 | 10 | 0 | 0 | 111 |

Of course the variable-length codes should be carefully determined so that the possibility of ambiguous decode results is minimized. For example, Code 3, below, would produce ambiguous decode results. In particular, using Code 3, the three bits "010" would result in an ambiguous decode as the decoder would have no way of determining if the code is a "010" representing the letter D or a "0" followed by a "10" representing the symbols "AC".

| Code 3 (Invalid) | |
|---|---|
| Symbol | Binary Code |
| A | 0 |
| B | 01 |
| C | 10 |
| D | 010 |

Huffman Coding

The standard means of choosing variable-length codes "carefully," to enable compression while preventing ambiguity, is called Huffman coding. A Huffman code assigns variable-length binary codes to an alphabet of symbols by arranging the symbols into a Huffman tree. For example, FIG. 1 illustrates a Huffman tree for the above-listed Code 2.

To encode a symbol using a Huffman tree, for example the Huffman tree illustrated in FIG. 1, the tree is followed from the top down, recording the 0's and 1's labeling the branches taken, until the desired symbol is reached. For example, to encode the symbol "C", the tree is followed to the right at the first branch (1), to the right at the second branch (1), and to the left at the third branch (0) to reach the symbol "C" in the tree, resulting in a recorded code of "110".

Similarly, to decode a string of bits, the tree is followed from the top down along the branches specified by consecutive bits, until a symbol is reached. The reached symbol is recorded and the position on the tree is reset to the highest position, where the tree is subsequently followed from the top down to determine additional symbols. For example, to decode "10110", the tree is followed to the right (1), then to the left (0), and a symbol "B" is reached. Returning to the top of the tree, the tree is followed to the right (1), then right again (1), then left (0), and a symbol "C" is reached. The bit stream "10110" is thus decoded to the symbols "BC". One of skill in the art will recognize that encoding and decoding by the above described Huffman tree "walking" process is theoretical. In practice, various faster table-based techniques are used to encode and decode Huffman codes.

Lempel-Ziv Coding

Lempel-Ziv (LZ) coding, in various forms such as LZ77, is often used in conjunction with Huffman Coding for data compression. Whereas Huffman coding seeks to reduce the number of bits consumed by individual symbols by assigning short codes to common symbols, Lempel-Ziv coding seeks to reduce the number of symbols stored by replacing repeated strings of symbols with special symbols (length/distance pairs) that describe the repetition. For example, to compress the string of 12 symbols provided below, Lempel-Ziv coding would first determine that there are no patterns repeated in the first four symbols and record the first 4 symbols, ABCD, literally.

| A | B | C | D | A | B | C | B | C | D | A | B |
|---|---|---|---|---|---|---|---|---|---|---|---|
| A | B | C | D |   |   |   |   |   |   |   |   |

The next two symbols, ABC, have been seen before in the same order. So instead of presenting them literally, Lempel-Ziv coding can use a length-distance pair to describe how to copy this string from earlier data. Since the previous ABC string begins 4 symbols back, and is 3 symbols long, Lempel-Ziv may use the length/distance pair (l:3)/(d:4), indicating that four symbols back from the present symbol are the next three symbols in the stream.

| A | B | C | D | A | B | C | B | C | D | A | B |
|---|---|---|---|---|---|---|---|---|---|---|---|
| A | B | C | D | l:3 | d:4 |  |   |   |   |   |   |

Similarly, the last five symbols, BCDAB, have also occurred before, six symbols back in the original. They can be replaced with the length/distance pair (l:5)/(d:6):

| A | B | C | D | A | B | C | B | C | D | A | B |
|---|---|---|---|---|---|---|---|---|---|---|---|
| A | B | C | D | l:3 | d:4 | l:5 |   | d:6 |   |   |   |

Thus, in the above described example, Lempel-Ziv coding replaced the original 12 symbols with only 8, half of which are "literals," and the rest of which compose length/distance pairs. Note that "d:4", for example, is considered a single abstract symbol. However, the characters "d", ":", and "4" are not literally written in a compressed file. In one embodiment, the various abstract length and distance symbols are represented in binary form.

Huffman-Coded LZ

Since Lempel-Ziv coding is an attempt at compression, the various abstract symbols it produces, including literals, length and distance symbols, should be represented in binary form as efficiently as possible. As mentioned previously, one method of representing symbols efficiently in binary form is Huffman coding. Several data compression algorithms include two main stages, namely, LZ coding and Huffman coding. An original string of data symbols is first replaced with a shorter string of LZ symbols, and then the LZ symbols are Huffman-coded into a binary representation.

In some compression algorithms, the possible length symbols are lumped together with the possible literals into a single symbol alphabet for Huffman coding, whereas the possible distance symbols are Huffman coded as a separate second alphabet. Thus, one Huffman tree defines the coding of literal and length symbols while a second Huffman tree defines the coding of distance symbols. Huffman-coded length symbols are directly distinguishable from coded literals because they each have distinct binary codes from the same Huffman tree. Furthermore, Distance codes are distinguished from Literal/Length codes by context; that is, in typical use a Distance code immediately follows a length code. Therefore, after a length symbol has been decoded, the decoder knows that the following Huffman code is a Distance code and the Distance tree should be accessed to decode.

In many applications, general-purpose Length/Literal and Distance Huffman trees are defined, which are reasonably well-suited to many data-compression applications. Such Huffman trees are referred to as "fixed" Huffman coding, because they use fixed predefined Huffman trees. Alternatively, Huffman trees may be defined using a particular file (such as Lempel-Ziv coded data) based on the actual frequencies of the various symbols in that file. This technique has been referred to as "dynamic" Huffman coding. If a particular length symbol is used very frequently in a certain LZ-coded file, then that symbol can be placed near the top of the dynamic length/Literal Huffman tree, so that it receives a relatively short Huffman code. For that matter, if a particular distance symbol is never used, it can be entirely omitted from the dynamic Distance Huffman tree, thus allowing other Distance codes to be shorter.

Dynamic Huffman coding requires that the specially-constructed Huffman trees, referred to as dynamic trees, used to code a certain file get stored in the compressed version of that file or are otherwise made available to the decoder, along with the Huffman codes themselves. For example, Dynamic trees may be transmitted in a data stream prior to the Huffman coded data. In one embodiment, the beginning and end of each dynamic tree are indicated by predefined codes in the data stream. Alternatively, the number and length of dynamic trees may be provided in the data stream before the dynamic trees.

Extra Bits

One important consequence of the storage of dynamic Huffman trees is the use of "extra-bits" fields in Huffman-coded LZ. In practical compression algorithms, there are a lot of possible length and Distance codes. Various algorithms need symbols to represent lengths of from 3 to 258 bytes, and distances of from 1 to several million bytes. While it might, all else being equal, be most efficient to give each possible length and distance its own Huffman code, that efficiency is quickly lost when dynamic Huffman trees with thousands or millions of entries are stored in the data stream.

One solution is to only provide Huffman codes for a relatively small number of length and distance ranges. The distance range of 1024-2047 bytes, for example, could be given a single Huffman code, and likewise the ranges of 2048-4095 bytes and of 4096-8191 bytes could each get a single Huffman code. By following such a geometric progression of range limits, the total number of Huffman codes required can be kept low enough that storing dynamic Huffman trees is not prohibitive.

In order to translate a Lempel-Ziv copy symbol in such a scheme, a Length or Distance Huffman code can be followed by several "extra bits" that provide the exact position within the coded range. For example, whenever a Distance code representing the range 1024-2047 bytes appears, it would be followed by a 10-bit extra-bits field, where the 10-bits are interpreted as a binary integer between 0 and 1023, The binary integer may then be added to the beginning point of the range, e.g., 1024, to yield an exact distance. The number of extra bits, and their meaning, is understood in the context of the Huffman code that preceded them. For example, in one embodiment, a "1024-2047" Distance Huffman code would be followed by exactly a 10-bit extra-bits field and a "2048-4095" Distance code would be followed by exactly an 11-bit extra-bits field.

Extra-bits may also be used in dynamic Huffman coding situations, other than coding Lempel-Ziv length and distance symbols, to specify whatever parameters are required to fully interpret the symbol alphabet without resorting to prohibitively large Huffman trees. Extra bits typically appear after the Huffman code they modify so that their number and meaning are understood in the context of that code.

DEFLATE is a compressed data format that is described in the Network Working Group Request for Comments (RFC) 1951, authored by P. Deutsch of Aladdin Enterprises in May 1996, which is hereby incorporated by reference for all purposes. Compression algorithms using the DEFLATE compressed data format provide lossless data compression using a combination of the Lempel-Ziv algorithm and Huffman coding. More particularly, DEFLATE uses Lempel-Ziv coding to reduce the number of symbols in a give block of data and subsequently uses Huffman coding to reduce the number of bits consumed by individual symbols (as discussed above). DEFLATE is used in various compressed formats, including GZIP and PKZIP.

GZIP is a compressed archive format that is described in the Network Working Group RFC 1952, authored by P. Deutsch of Aladdin Enterprises in May 1996, which is hereby incorporated by reference for all purposes. GZIP uses DEFLATE for compression and additionally includes various header information with the DEFLATE compressed data.

RAR is a commercial compression and archiving software product authored by Eugene Roshal. Various compression applications have been created by business entities, such as RARLAB, rarsoft, and WinRAR, for example.

As noted above, there are many compression techniques that make use of Huffman coding and decoding. Accordingly, systems and methods for increasing the speed and efficiency of decoding Huffman codes are desired.

In operation, one or more Huffman trees indicating the coding of the various symbols in a data block are initially created for the data block using an encoder. The Huffman trees may then be stored in any type of memory or storage device for later use by a Huffman decoder. However, the Huffman trees for a coded data block must be placed in a location that is accessible by the Huffman decoder, typically remote to the encoder, before decoding of the data block may begin. The transfer of the Huffman trees from the storage device to the decoder memory often takes considerable time and delays the decode operation. Thus, a system and method of reducing the time required to store Huffman trees in a decoder memory is desired.

During a decode operation of a data stream having variable length coded data, such as a Huffman decode operation, a decoder determines the length of each variable length code as the variable length code is received by the decoder. The process of determining the length of a variable length code, however, consumes valuable time. Because a decoder can only decode a variable length code if at least the position of the first bit of the code is known, a decoder cannot decode a subsequent variable length code until the length of the previous variable length codes have been determined. Thus, the decode process is slowed by the necessity of determining code lengths of the variable length codes. Accordingly, a system and method for reducing the time required to determine a length of variable length codes in a data stream is desired.

SUMMARY OF THE INVENTION

Several code detectors in parallel simultaneously examine varying overlapping segments of a portion of an input data stream, referred to as a data window. The data window segments directly address RAM structures within each of the code detectors without any previous logic stages. In an advantageous embodiment, each code detector is responsible for a range of code lengths, and ignores data window bits that are not relevant to its code length range. Each code detector outputs a possible result to a layer of logic that selects the possible result of the single code detector which contains result data corresponding to the Huffman code.

According to another aspect of the invention, because each code detector is only responsible for a relatively narrow range of code lengths, result data corresponding to the Huffman codes need not be written to large numbers of redundant locations, thus reducing overhead time spent writing result data to memory for each new set of decode trees.

According to another aspect of the invention, Huffman codes may be decoded in a single stage. More particularly, a single RAM lookup using bits of the data window, plus a layer of logic, may produce all necessary result data for Huffman codes of any length.

According to another aspect of the invention, a decode architecture may be implemented according to multiple degrees of freedom to choose how many code detectors to use, and how to map Huffman code types and lengths to them. This flexible architecture allows common code types and lengths to be assigned positions requiring zero or few redundant writes and RAM usage appropriate to platform resources and timing.

Conventionally, every lookup of a value from the data window, where the data window includes an unknown Huffman code, assumes the possibility of any binary pattern. Because the potential Huffman codes can be relatively long (e.g. 15 bits), a lookup addressed by these potential codes must either take place in a rather large memory structure, or else be performed in multiple stages. Thus, according to another aspect of the invention, when a code detector is assigned one or more relatively long code lengths from one or more Huffman trees, it is in certain cases determined that any valid Huffman code of those lengths and types would necessarily have a certain number of its leading bits equal to a fixed value (such as '1' in the Huffman coding used by DEFLATE, but potentially '0' in other schemes). Thus, the code detector may assume that those leading bits in the data window are indeed '1's, and not use them for address bits while a parallel piece of logic (e.g. a registered AND gate) checks whether that assumption is true. The code detector output is used only if the leading bits are determined to be '1' by the parallel logic.

According to another aspect of the invention, with the realization that the leading bits of a large Huffman code have a certain number of similar bits, e.g. '1', a single RAM structure of manageable size (e.g. 9 to 11 addressable bits rather than 15 or more) is sufficient to detect codes of a given length (or range of lengths) through a single-stage lookup, thus conserving RAM resources. In addition, smaller, or fewer, RAM resources may result in shorter routing and/or faster lookups, so the decode operations may be more rapidly executed.

Conventionally, the length of a Huffman code and the length of its associated extra-bits field are determined separately, and these two data items are shifted sequentially out of the data window. Alternatively, the two lengths are added after being separately determined by a decoder, and the total number of bits are shifted together out of the data window. According to another aspect of the invention, the sum of the lengths of each Huffman code and its associated extra-bits field are pre-computed, pre-formatted as a shift distance (e.g. subtracting 1 in one embodiment), and stored in the code detector RAMs at the time that the tree builder receives the Huffman Trees from the data stream or from another device. Accordingly, during Huffman decoding, the one code detector which detects a particular Huffman code outputs the formatted total length as part of the result data. The select logic may then pass this formatted total length immediately to the shifter as a shift distance so that both the Huffman code and its associated extra-bits field get shifted out of the data window simultaneously. Advantageously, pre-storage of the total length of a Huffman code and its associated extra-bits field eliminates the need to add the lengths of the Huffman code and the extra-bits field at decode time and also allows the shifting of both portions out of the data window in a single shift. Additionally, the time required to determine the length of each Huffman code, including its extra-bits field, may be reduced to the time taken to perform the code detector lookups, select one code detector output, and shift the total length by the shifter. In one embodiment, this loop may be efficiently executed in a single clock cycle.

The dynamic Huffman decoder architecture described herein may be used inside a hardware accelerator for decompressing GZIP, PKZIP, DEFLATE, or LZH encoded data; for example, in addition to other archive formats. The Huffman decoder architecture may be used not only to decode dynamic and fixed Huffman-coded Lempel-Ziv codes (Length/Literal/EOB and Distance codes as described herein where EOB is an End of Block symbol indicating the end of a data block), such as those used by DEFLATE, but to also decode the dynamic Huffman codes used to run-length encode DEFLATE and LZH's dynamic Huffman trees.

Variable length coding is used in many compression schemes, both lossless (for binary data) and lossy (for sound, graphic, video or other analog-type data). Almost any class of compression algorithm or data representation, such as Lempel-Ziv, run-length, differential, Fourier, wavelets, and Huffman, for example, can be usefully wrapped by variable length coding. Thus, the techniques described herein may be applied to variable length decoding used in any environment.

DETAILED DESCRIPTION OF EMBODIMENTS OF THE INVENTION

Embodiments of the invention will now be described with reference to the accompanying Figures, wherein like numerals refer to like elements throughout. The terminology used in the description presented herein is not intended to be interpreted in any limited or restrictive manner, simply because it is being utilized in conjunction with a detailed description of certain specific embodiments of the invention. Furthermore, embodiments of the invention may include several novel features, no single one of which is solely responsible for its desirable attributes or which is essential to practicing the inventions herein described.

Figure 1:
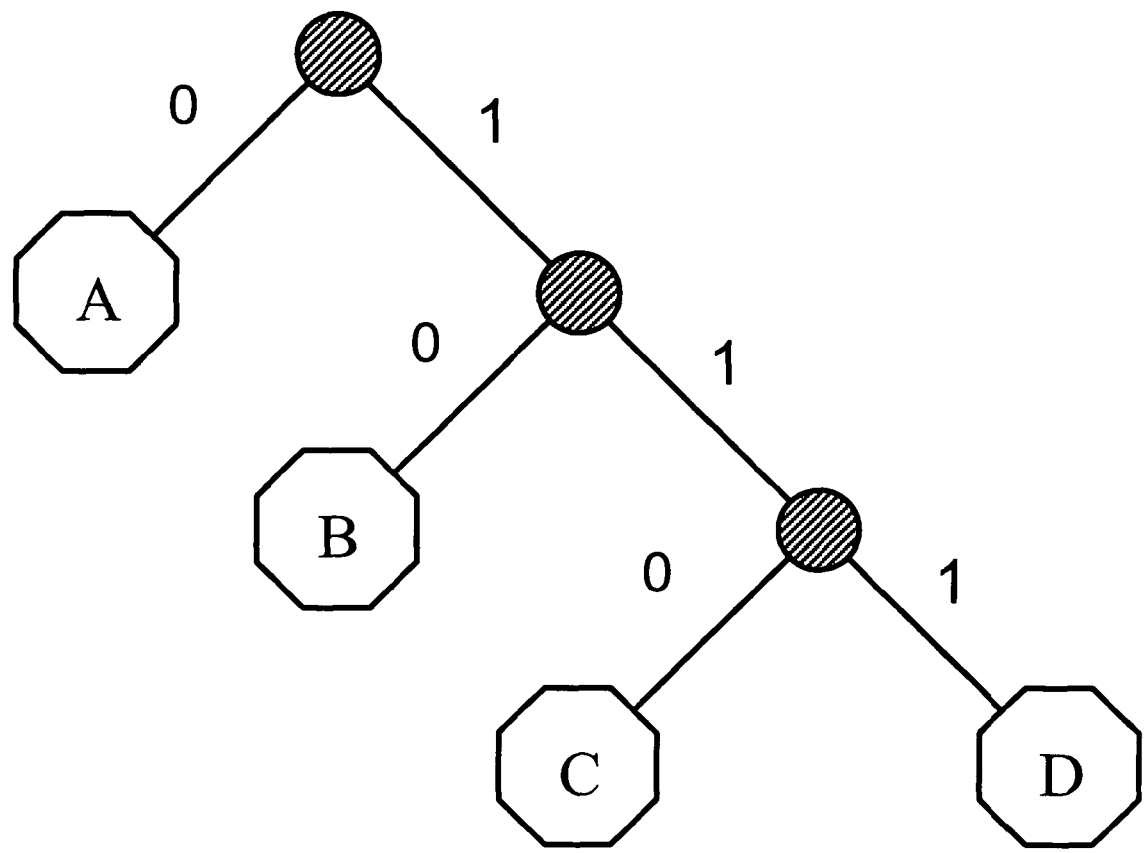
FIG. 1 illustrates an exemplary Huffman tree.
Figure 2:
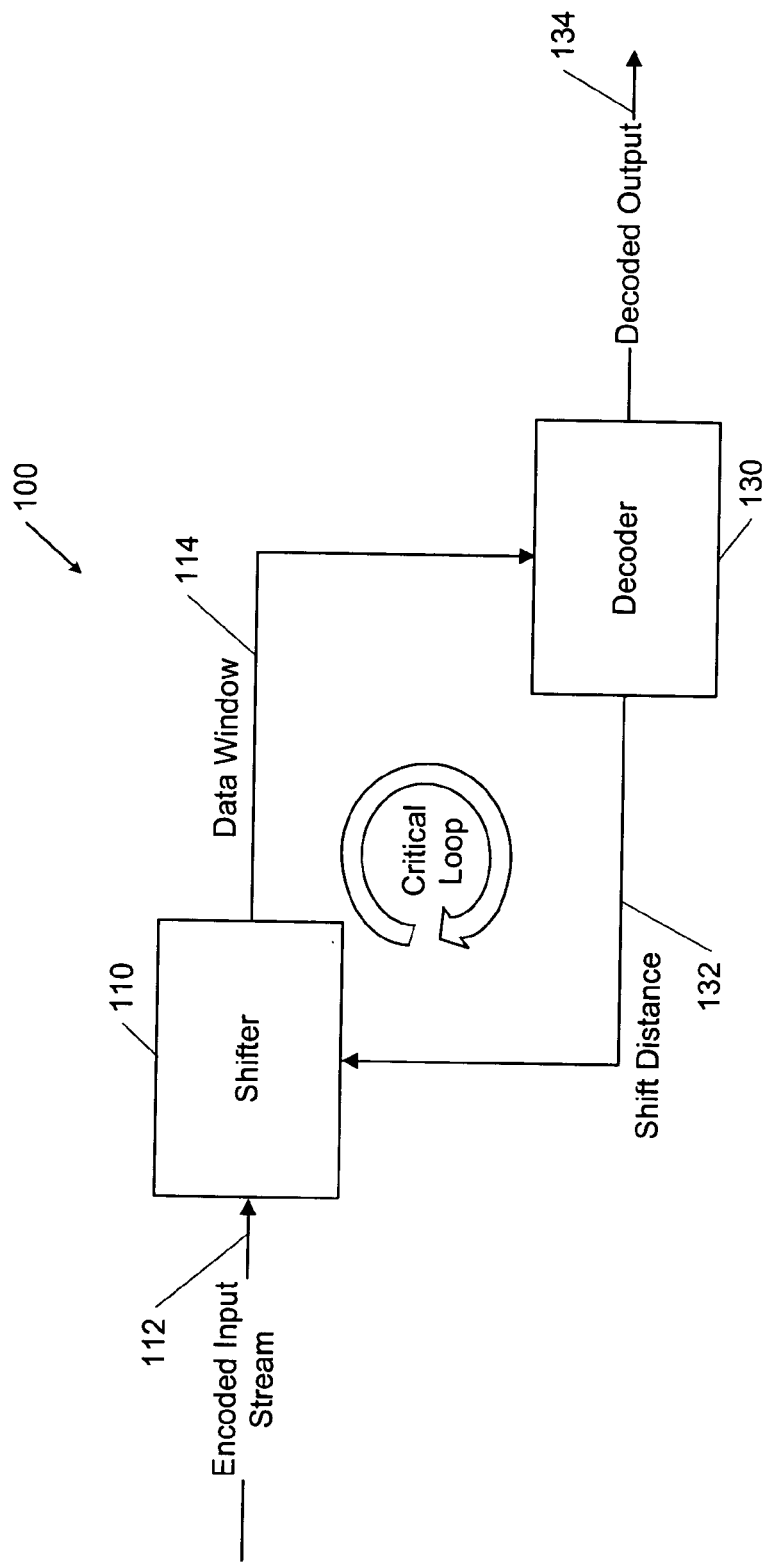
FIG. 2 is a block diagram illustrating a system for decoding a data stream.

FIG. 2 is a top level block diagram illustrating the components of a system for decoding a data stream. As illustrated in FIG. 2, the system 100 includes a shifter 110 and a decoder 130, The shifter 110 receives a stream 112 of Huffman-encoded input data. The encoded input stream 112 may be a sequence of bytes, or a sequence of 32-bit words, for example. Regardless of its format, the input stream 112 comprises a sequence of Huffman codes and extra-bits fields, which may be of various bit-lengths, and which are not necessarily aligned to word boundaries of the input stream. In one embodiment, a single Huffman code or extra-bits field may span the boundary between words of the input stream.

The shifter 110 outputs a data window 114, which is a fixed number of consecutive bits of the encoded input stream 112, When an input stream 112 is initially received at the shifter 110, the data window 114 will include a fixed number of the first bits of the encoded input stream 112, The decoder 130 accesses the data window 114 and performs various decode operations, as discussed in further detail below, including the determination of a length of a variable length code (VLC), such as a Huffman code, in the data window 114, The discussion of Huffman codes herein is intended to illustrate aspects of the systems and methods described herein, and not as a limitation of the scope of the systems and methods. The use of Huffman codes herein is exemplary of one type of VLC. Accordingly, it is anticipated that the methods and systems described herein are equally applicable to any type of VLC, in addition to the exemplary Huffman code examples.

The decoder 130 looks for Huffman codes aligned to the beginning of the data window 114, For example, the decoder 130 looks for 3-bit Huffman codes in data window 114 bits 0 to 2, 12-bit Huffman codes in data window 114 bits 0 to 11, and more generally, N-bit Huffman codes in data window 114 bits 0 to (N−1). Once a Huffman code is detected by the decoder 130, the length of the Huffman code is also known and the beginning bit of a subsequent Huffman code is known. Accordingly, the data window 114 is shifted by the determined length of the Huffman code so that subsequent Huffman codes may be identified and decoded.

The shifter 110 is coupled to the decoder 130 and receives the length of the Huffman code, referred to herein as a shift distance 132, from the decoder 130, indicating a number of bits to shift the input stream 112 to define the next data window 114, The shifter 110 then shifts the data window 114 by the requested number of bits along the input stream 112 and a data window including a subsequent Huffman code is made available to the decoder 130, In one exemplary embodiment, the shifter 110 presents a data window 114 including 32 bits. Thus, the data window 114 will initially contain bits 0 to 31 of the encoded input stream 112, After the shifter 110 receives a shift distance 132 of 10 bits, for example, the shifter 110 will shift bits in the data window 114, using internal storage elements and the input stream 112, so that the data window 114 contains bits 10 to 41 of the input stream. After the shifter receives a subsequent shift distance 132 of 15 bits, for example, the data window 114 will contain bits 25 to 56 of the input stream 112, In another embodiment the data window 114 has a width of 16 bits. One of skill in the art will recognize that the data window 114 may be of any length, such as, for example, 3, 8, 10, 16, 20, 32, 55, 64, or 128 bits. In one embodiment, the width of the data window 114 is greater than or equal to the maximum number of bits in a coded Huffman code.

In one embodiment, the shift distance 132 may be represented in any format. For example, in one embodiment, shift distances 132 from 1 to 32 bits are represented by 5-bit binary values from "00000" to "11111". Similarly, shift distances 132 from 1 to 16 bits may be represented by 4-bit binary values.

Figure 3:
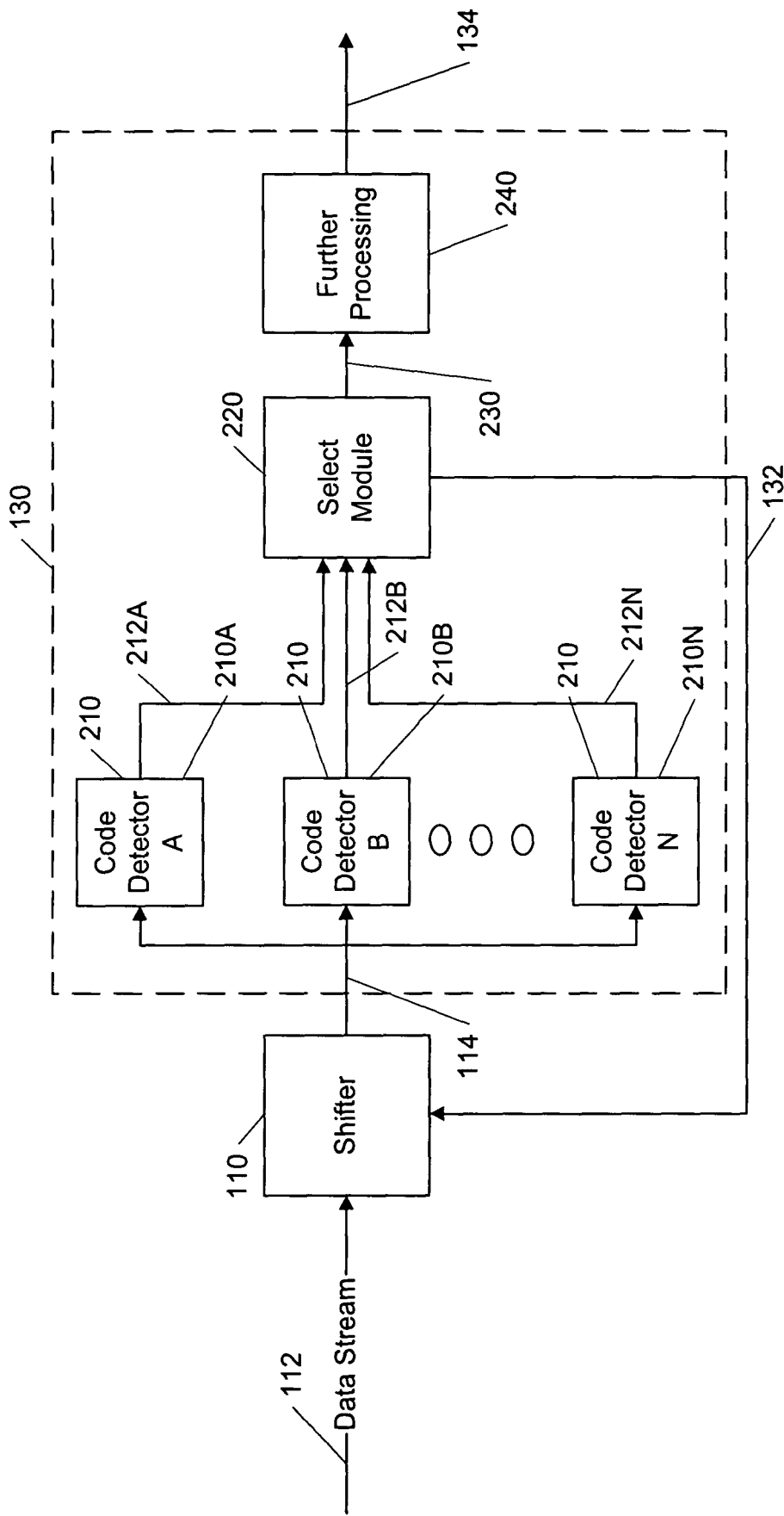
FIG. 3 is a block diagram illustrating a system for decoding a data stream including a decoder having multiple parallel code detectors.

In one embodiment, after the decoder 130 sufficiently processes one or more segments of the bits in the data window 114, the decoder outputs the shift distance 132 to the shifter 110, The shifter 110, in turn, shifts the data window by the received shift distance 132 and effectively shifts the bits of a single coded Huffman code from the data window 114, When the processed Huffman code has been shifted out of the data window 114 fresh input data from the input stream 112 fills the data window 114, For example, if the decoder 130 examines a 32-bit data window 114 and determines that bits 0 to 8 compose a 9-bit Huffman code, the decoder 130 presents a shift distance 132 of 9 bits to the shifter 110, The decoder 130 must of course remember those 9 bits, and decode them into a symbol for the decoded output 134, but some of this further processing can take place in a pipelined manner after the 9 bits are shifted out of the data window 114, Alternatively some of the further processing may actually be included in the result data stored in the decoder 130, For example, the actual symbol which was coded may be included in the result data. For another example, if the decoder 130 determines that bits 0 to 14 in the data window 114 are a 15-bit Huffman code, followed by bits 15 to 27 which are a corresponding 13-bit extra-bits field, then the decoder 130 presents a shift distance of 28 bits to the shifter 110 to shift both the Huffman code and the extra-bits field out of the data window 114, FIG. 2 illustrates a critical loop of data flow between the shifter 110 and the decoder 130, In general, a system that decodes variable length code words, such as Huffman codes, whether software or hardware, must determine the length of a first variable length code before a second variable length code can be decoded. Thus, even though many operations, including decode operations, may be performed in parallel, or in a pipelined manner, the necessity of determining the length of each Huffman code creates a critical loop between the shifter 110 and the decoder 130 that limits the speed of the decoding operations. More particularly, when a Huffman decoding system receives a sequence of dynamic Huffman codes (each possibly including an extra-bits field), $C_0$, $C_1$, $C_2$, . . . , the system does not immediately know how many bits long each Huffman code is. As a direct consequence, the system does not know where each Huffman code begins or ends, except that the very first code, $C_0$, begins at bit 0 of the encoded input stream. It is very difficult, or at least very expensive in terms of computing resources, for the system to begin translating a given Huffman code before knowing where it begins or ends. Therefore, while it is not necessary to completely decode each Huffman code before beginning to decode the next one, it is more-or-less necessary to determine the length of a Huffman code before beginning to decode a subsequent Huffman code. The critical loop thus comprises (1) the decoder 130 determining the total length of the Huffman code and possible extra-bits field which begins at bit 0 of the data window 114 and providing this length as a shift distance 132 to the shifter 110, and (2) the shifter 110 shifting the encoded input stream 112 by the shift distance 132, so that the next Huffman code thereafter begins at bit 0 of the data window 114, FIG. 3 is a block diagram of a system for decoding a data stream including a decoder 130 having multiple parallel code detectors 210, The decoder 130 receives the data window 114 from the shifter 110, The data window 114 has a width w and contains data W, so the bits are W[0], W[1], . . . , W[w−1], or written as a range W[w−1:0]. While an embodiment having a data window 114 with width w=32 is discussed hereinafter, the concepts described are equally applicable in a system having a data window 114 width of any size. Therefore, the particular discussion of the decoding system described herein is not intended to limit the scope of the invention, but rather to describe an exemplary embodiment of such a system.

The decoder 130 expects a Huffman code starting at W[0]. The Huffman code may be any length from 1 bit up to some maximum length, m (e.g., m=15 for DEFLATE). In an advantageous embodiment, w≧m, so that the entire Huffman code will be visible in a single data window 114, Inside the decoder 130, several (K) code detectors 210 make parallel attempts to determine which Huffman code starts at W[0]. As described below with reference to FIG. 4, each code detector 210 is initialized by a tree builder 310 or other circuitry before receiving any Huffman codes. More particularly, memory devices in the code detectors 210 are written with result data that is used to decode data in the data window 114, In an advantageous embodiment, each code detector 210 is responsible for detecting a certain set of Huffman codes. For example, each code detector 210 is responsible for detecting Huffman codes with a particular bit length, or in a range of bit lengths. Furthermore, when multiple Huffman trees are in use, such as Length/Literal/EOB trees and Distance trees, a single code detector 210 may be responsible for detecting codes from one or more of the trees.

In one embodiment, one or more code detectors 210 are responsible for codes from multiple trees and the ranges of code-lengths vary from tree to tree. For example, the exemplary configuration of a decoder 130 illustrated below in Table 1 shows five (5) code detectors 210 each configured to decode different Huffman codes. More particularly, each of the code detectors 210A-210E is configured to decode different lengths of Length/Literal/EOB Huffman codes and certain of the code detectors (excluding code detector 210D, for example) are additionally configured to decode different lengths of Distance Huffman codes.

TABLE 1

| code detectors 210 | Literal/Length/ EOB Code Lengths | Distance Code Lengths |
| --- | --- | --- |
| 1. (210a) | 1-5 | 1-5 |
| 2. (210b) | 6-8 | 6-8 |
| 3. (210c) | 9-10 | 9-10 |
| 4. (210d) | 11-13 | None |
| 5. (210e) | 14-15 | 11-15 |

In one embodiment, each code detector 210 outputs various result data in response to analysis of the data in the data window 114, This result data may include any available data, such as, for example, a valid flag, a length of the Huffman code, a number of extra bits associated with the Huffman code, a sum of the total length of the Huffman code and its associated extra-bits field, an indication of the type of symbol that was coded, e.g. Length/Distance vs. Literal Byte/end of block (EOB), an index of the specific symbol which was Huffman-coded, e.g. 0-255 for a Literal Byte, a binary field that, when appended to any associated extra-bits, yields an exact net value, e.g. an exact length or Distance Lempel-Ziv value, and/or any other data pertaining to the coded symbol which is useful for producing the final decoded output 134, In normal operation, exactly one of the K code detectors 210 will detect a Huffman code, where K is the total number of code detectors 210, Thus, each of the outputs of the code detectors 210A-210N are termed possible results 212A-212N as only one of the possible results 212 will actually be used in determining the length of and decoding the Huffman code. An additional layer, shown in FIG. 3 as the select module 220, examines the possible results 212 output from the K code detectors 210, and reflects the output of the single detecting code detector 210 as the actual result 230, The determination of the actual result 230 may be accomplished in various ways. For example, a "Valid" flag may be included in each of the possible results 212, e.g. '1' on detection or '0' on non-detection. Thus, the possible results from each of the code detectors 210 that were not written with result data from the tree builder will output the null code with a '0' in the Valid flag bit while the single code detector 210 that was written with result data from the tree builder will output the result data, which includes a '1' in the Valid flag bit. Accordingly, the select module 220 may select the single valid possible result based on the presence of a '1' in the Valid flag bit. In other embodiments, the actual result 230 may be determined based on other bits, groups of bits, or bit patterns, for example, in the possible results 212, In one example, the select module 220 determines the actual result 230 by logically ANDing, ORing, or applying other logical operations, to all of the possible results 212, In one embodiment, the actual result 230 includes the total length of the detected Huffman code and extra-bits field. This total length may be immediately sent to the shifter 110 as a shift distance 132 so that the data window 114 may be shifted and the critical loop may be minimized. The actual result 230 may also proceed into a further processing module 240 which may be used to produce the decoded output 134 in whatever format is needed. Thus, in one embodiment the actual result 230 comprises one of the possible results 212 and the output of the further processing module 240 comprises the decoded output 134, which is the output of the entire decoder 130, This further processing can be leisurely pipelined, however, since it is not part of the critical loop. In another embodiment, the decoder 130 does not include the further processing module 240 such that the decoded output 134 is the actual result 230, In one embodiment, the data window 114 W, which may be delayed if necessary to align properly with the actual result 230, may also be used by the further processing module 240, For example, if the actual result 230 indicates that extra bits were present in the data window 112, the extra bits may be extracted from the data window 114, and even from subsequent bits in the data stream 112, if necessary. In this embodiment, the actual result 230 indicates both the length of the detected Huffman code and the length of the associated extra-bits field, allowing the further processing module 240 to locate the beginning and end of the extra-bits field within W. To illustrate, if the actual result 230 indicates a Huffman code length of 12 bits and an extra-bits length of 8 bits, then the extra-bits field associated with the detected Huffman code is in W[19:12]. This extra-bits field can be combined with other data in, or derived from, the actual result 230, to produce, for example, the exact Lempel-Ziv length or distance that was coded, which would be part of the decoded output 134, In order to optimize the speed of the critical loop, it is desirable that the time required for a single pass around the critical loop is minimized. In one embodiment, the time required for the decode system to complete a revolution between the shifter 110, the code detectors 210, and the select module 220 requires only one clock cycle. In one embodiment, a code detector includes RAM resources which incorporate a single register. Thus, to optimize the critical loop, the critical path through the shifter 110 is combinational. The critical path for each clock cycle begins at the output of the code detector 210, travels through the select module 220, into the shifter 110 as a shift distance 132, and through the shifter 110 combinationally to the data window 114, ending at the address inputs of the code detectors 210, In one embodiment, the code detectors 210 are implemented using one or more FPGA's, such as the Virtex-II FPGA's manufactured by Xilinx.

Code Detector Architecture

In one embodiment, each code detector 210 is primarily a RAM (random-access memory) or similar structure, which stores a table of possible results 212, In another embodiment, each code detector 210 is a portion of a single RAM, where the RAM is partitioned into separately addressable storage areas for each code detector 210, Accordingly, references made herein to address lines of a code detector 210 are in certain embodiments address lines to a RAM portion of a code detector 210, The code detectors are each addressed by a segment of bits from the data window 114 W. The most-significant bit of W used to address a code detector 210 RAM is that of the longest Huffman-code length that each particular code detector 210 is responsible for detecting. By default, the least-significant bit of W used to address the RAM is bit 0, For example, in one embodiment, code detector 210B, which is responsible for detecting 6-8 bit Length/Literal/EOB and Distance codes, is addressed by W[7:0] and code detector 210C, which is responsible for detecting 9-10 bit Length/Literal/EOB and Distance codes is addressed by W[9:0].

If a code detector 210 is responsible for detecting codes from multiple Huffman trees, one or more address bits may be used to select among the decode trees. For example, in one embodiment one or more code detectors 210 may use an additional address bit to select between the Length/Literal/EOB tree and the Distance tree. In such an embodiment, additional state logic, such as that in tree select module 520

(FIG. 6), may determine which Huffman tree a code is expected from next and supply the corresponding address bit(s) to the code detectors 210, For example, in one embodiment, state logic determines that a Distance tree stored in one or more code detectors 210 is to be used immediately after a length code is detected.

One of ordinary skill in the art will recognize that it is generally irrelevant how the address bits are ordered and assigned, so long as the addressing of each detector 210 is always done consistently. For example, the bit used to select between Huffman trees may be either the most significant address bit or the least significant, or any other bit, so long as the use of the bit is consistent. Similarly, bits from the data window 114 may be mapped to the code detector 210 address bits in any order so long as the order is known and consistent.

Figure 4:
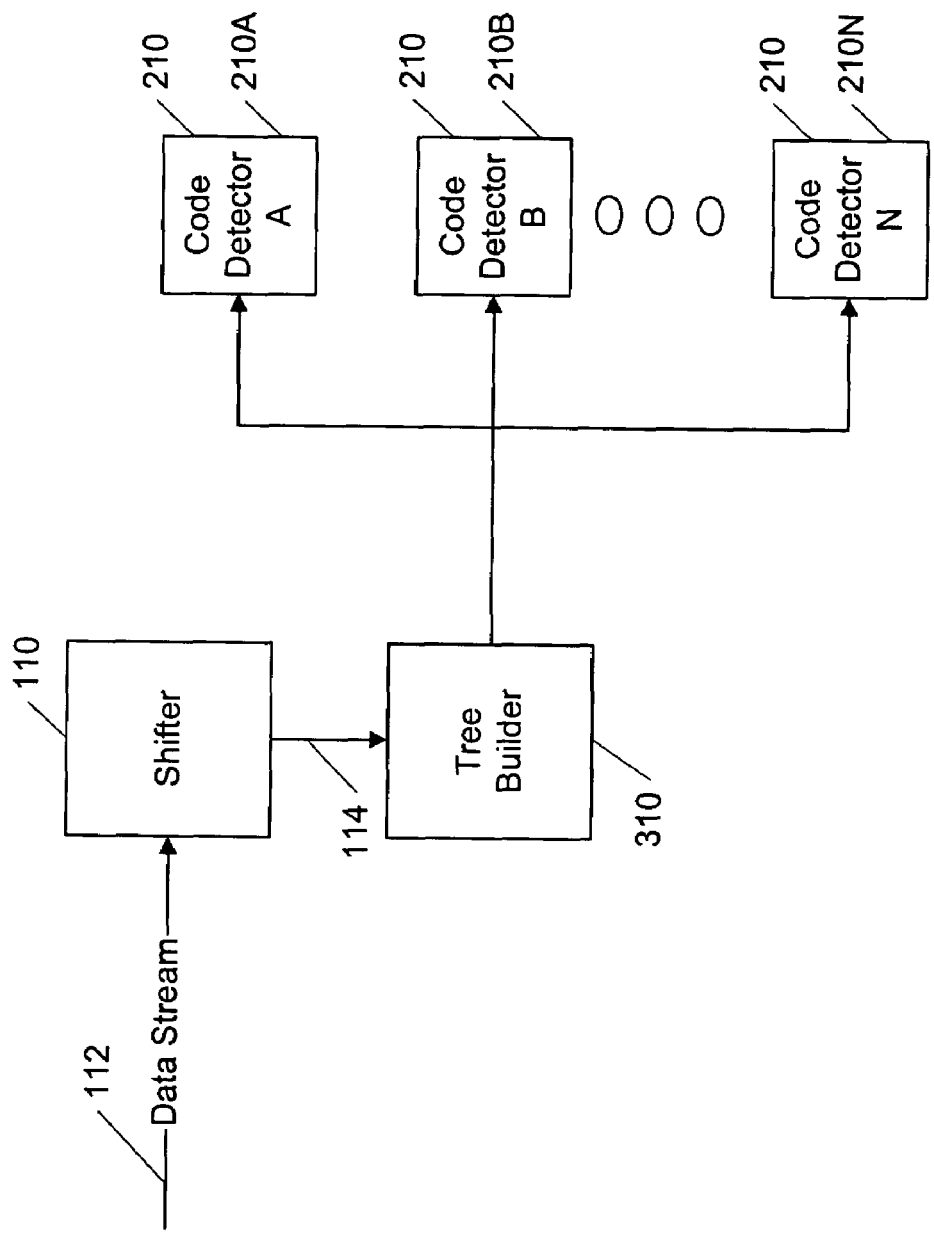
FIG. 4 is a block diagram illustrating parallel code detectors coupled to a tree builder.

FIG. 4 is a block diagram illustrating parallel code detectors 210 coupled to a tree builder 310, In dynamic Huffman coding, one or more dynamic Huffman trees built by a data encoder (not shown) are stored in the data stream so that the dynamic Huffman trees are received by the shifter 210 before the data block of Huffman codes. Alternatively, the dynamic Huffman trees may be located in a separate location, such as an external memory. In an advantageous embodiment, the Huffman trees are received by the tree builder 310, and stored in the appropriate code detectors 210, before the Huffman codes are received. The tree builder 310 is coupled to the shifter 110 and each of the code detectors 210, The tree builder 310 is responsible for reading these stored Huffman trees from the data stream 112 and writing the necessary data into the code detectors 210 of the decoder 130 (FIG. 2), so that the decoder 130 can thereafter decode the associated Huffman codes. In one embodiment, the tree builder 310 is also used to initialize RAM structures of the code detectors 210, erasing Huffman code information after a set of trees is used and/or writing predefined data to addresses of the code detectors 210, In one embodiment, some or all of the dynamic Huffman trees recorded in the data stream 112 may themselves be Huffman coded. For example, DEFLATE stores Huffman coded Length/Literal/EOB and Distance trees, and LZH stores Huffman coded Length/Literal trees. In such cases, the decoded output 134 may be coupled to the tree builder 310 so that the decoder 130 may be used to decode the coded Huffman trees. In this exemplary configuration, a preliminary set of coded Huffman trees may first be written to the code detectors 210 by the tree builder 310, The decoder 130, such as shown in FIG. 3, may then decode the stored coded Huffman trees and provide the decoded Huffman trees to the tree builder 310, The tree builder 310 may then write the corresponding Huffman trees into the code detectors 210, In one embodiment, the tree builder 310 reads stored Huffman trees from the data window 114, generated by the shifter 110, In some Huffman coding architectures, such as DEFLATE, dynamic Huffman trees are stored using fields of various bit lengths. Therefore, it is convenient for the tree builder 310 to use the capabilities of the shifter 110 to align data to useful positions. In other embodiments, the tree builder 310 receives data from other sources, such as external memories. In another embodiment, the tree builder 310 may be coupled directly to the data stream 112 such that the Huffman trees are received directly from the data stream 112 without the use of a shifter 110, In one embodiment, the address in the code detector 210 is the Huffman code itself (with additional address bit(s) set appropriately for tree selection).

Before a code detector 210 can be used to detect Huffman codes, the RAM of the code detector 210 must be filled by the tree builder 310 with result data derived from the dynamic Huffman tree or trees in use. Each Huffman code in each tree must have corresponding result data written to the RAM of exactly one code detector 210—whichever one is responsible for its tree and code length. For example, in one embodiment, the tree builder 310 writes result data for each 1-5 bit Huffman code in the RAM of code detector 210A, the result data for each 6-8 bit Huffman code in the RAM of code detector 210B, and so on. As discussed above, the result data written to the RAM of the code detectors 210 may include any type of result data, such as a valid flag, code length, number of extra-bits, sum of the code length and number of extra bits, for example. In one embodiment, result data corresponding to a given Huffman code is written to one or more addresses within a single code detector 210, For example, if a particular result data corresponds with a Huffman code that is the maximum length for a particular code detector 210 (e.g., a 8 bit Huffman code in a 6-8 bit length code detector 210), the result data may be written to only a single address in the code detector. More particularly, in one embodiment an 8-bit Distance code "00110101", which is the longest Distance code that a code detector 210 is responsible for (such as code detector 210B, for example), would have its result data written to the RAM of the code detector 210, at the single address "1 00110101" where the leading '1' dictates the use of a Distance tree portion of the RAM.

If, however, a Huffman code is shorter than the maximum bit length for the corresponding code detector 210 (e.g., a 6 bit Huffman code in a 6-8 bit length code detector 210), the result data is written to several different addresses within the code detector 210, This is because it is not known which bits will follow such a "short" Huffman code in the data window 114, and will thus contribute to addressing the RAM of the code detector 210, Result data for such a "short" code is written to every address that begins with the Huffman code (including any tree-selecting address bits fixed to select the appropriate tree). For example, in one embodiment a 6-bit Huffman code "110011" has its result data written to a 6-8 bit length code detector 210 at 4 addresses, namely: "00 110011", "01 110011", "10 110011" and "11 110011". Thus, the 6 least significant bits are fixed to the Huffman code value of "110011", and the remaining 2 bits are assigned all 4 possible values, "00", "01", "10" and "11". Additionally, if the code detector is responsible for both Length/Literal/EOB and Distance decoding, a bit may be used to signify the type of Huffman code. For example, the most significant bit may be fixed to '0' to select the Length/Literal/EOB tree. Accordingly, the 6-bit Huffman code "110011" may be stored at the 4 addresses: "0 00 110011", "0 01 110011", "0 10 110011" and "0 11 110011". By using this redundant result data filling of the code detectors, the data bits beyond the 6-bit Huffman code are irrelevant as each possible combination results in the same output result data from the code detector 210, In one embodiment, the tree builder 310 is also used to fill all addresses of code detectors 210 that are not addressed by a Huffman code with a null value or a value that will be ignored by the selecting module 220 (FIG. 5), such as all 0's or 1's, or any predetermined combination thereof, such as "00000000000011111". In effect, all the RAMs of the code detectors 210 should be set to the predetermined null value, or effectively "erased", prior to writing any result data therein. The RAMs of the code detectors 210 should additionally be filled with the null value after each use with a given set of Huffman trees. In one embodiment, the RAMs of the code detectors 210 are selectively erased by setting to the null value only the addresses that were previously written with result data. By pre-erasing the code detectors 210, the mistaken detection of a Huffman code not used in the current set of Huffman trees is reduced.

Figure 5:
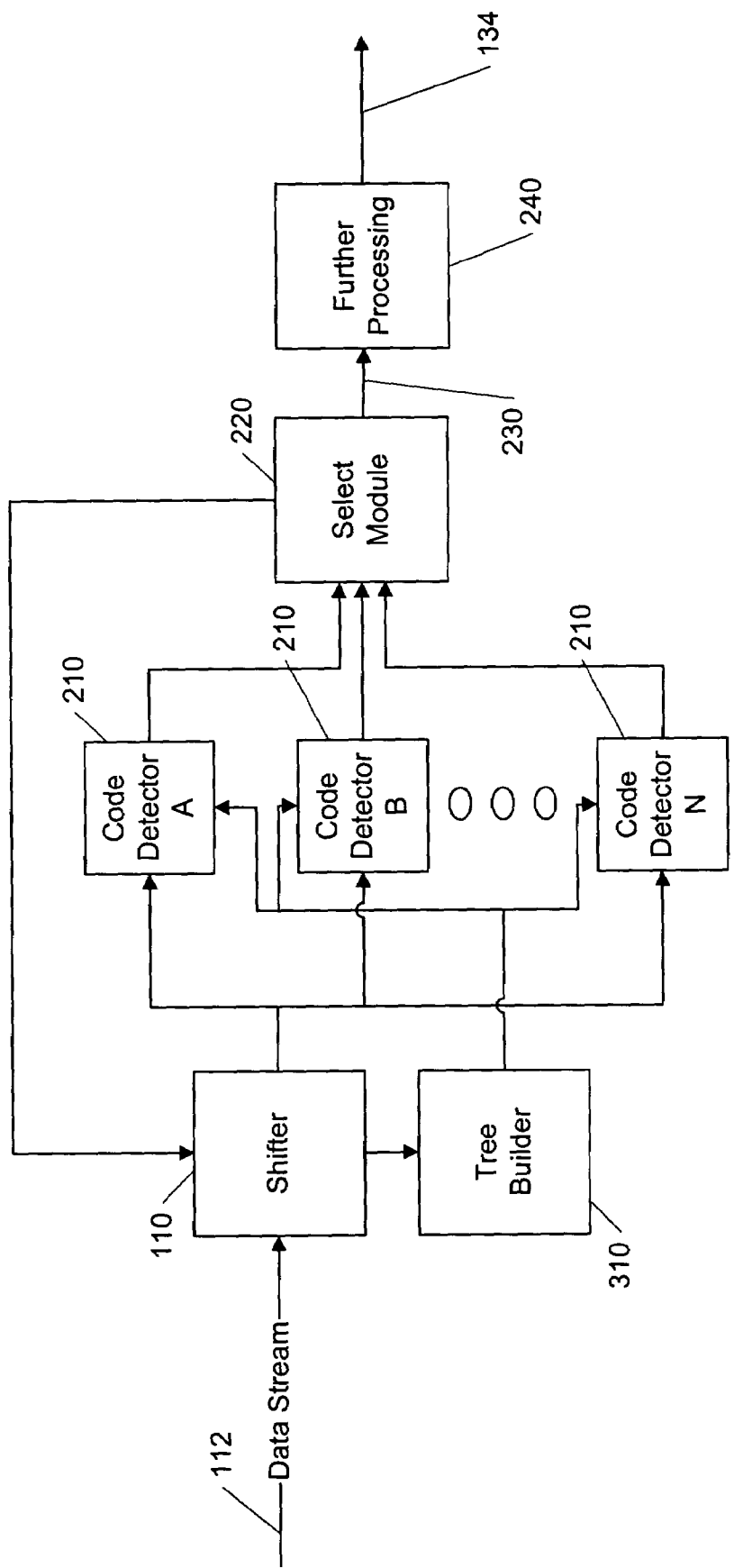
FIG. 5 is a block diagram illustrating parallel code detectors coupled to a shifter, select module, and a tree builder.

FIG. 5 is a block diagram illustrating parallel code detectors 210 coupled to the shifter 110, the select module 220, and the tree builder 310, As described above, result data is stored in the code detectors 210 by the tree builder 310, In one embodiment, each set of result data is stored in only one of the code detectors 210 according to the length of the corresponding Huffman code. The shifter 10 may work in conjunction with the tree builder 310 in the tree building process, and also with the select module 220 in shifting the data stream 112 as the Huffman codes are decoded.

Figure 6:
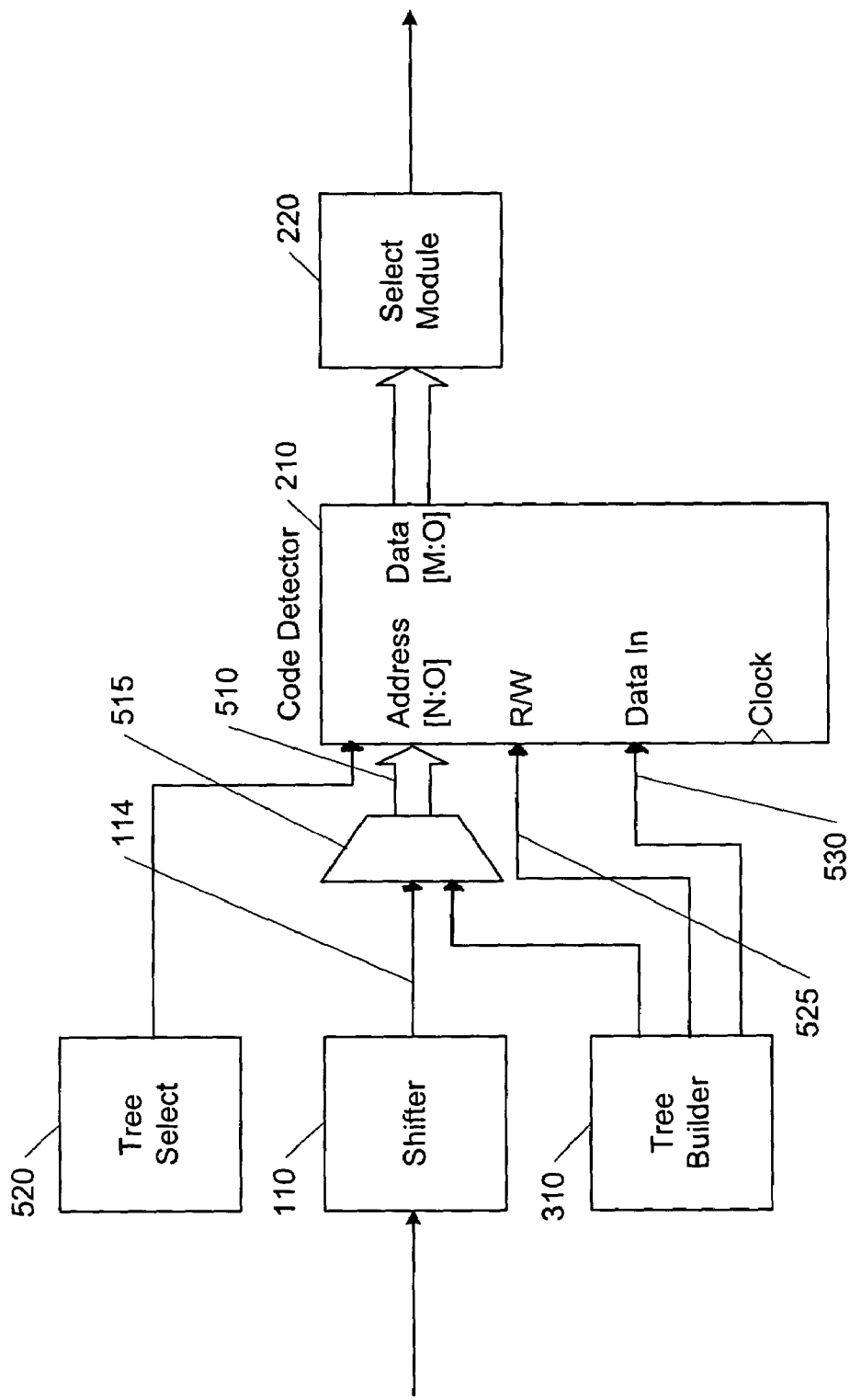
FIG. 6 is a block diagram illustrating a single code detector coupled to the shifter, the tree builder, and the select module.

FIG. 6 is a block diagram illustrating a single code detector 210 coupled to the shifter 110, the tree builder 310, and the select module 220, The code detector 210 of FIG. 6 is exemplary of the code detectors 210 illustrated in FIGS. 2-4, The code detector 210 illustrated in FIG. 6 includes an address port comprising multiple address lines 510, The address lines 510 are coupled to the output of an input select module 515 which has inputs coupled to the shifter 110 and the tree builder 310, As discussed above, the code detector 210 must be filled with the result data, such as that contained in Huffman trees, before the Huffman codes may be decoded. Thus, the tree builder 310 accesses the code detector 210 and is coupled to the code detector 210 via the input select module 515, Also, the shifter 110 provides the data window 114 to the input select module 515 which, in turn, provides data on the address lines 510 of the code detectors 210, Accordingly, the input select module 515 operates to alternatively provide inputs to the address lines 510 from the shifter 110 and the tree builder 310, The input select module 515 comprises any type of logic device, such as a multiplexer, and selects which device is coupled to the address lines 510 at any time. When a Huffman tree is to be written to the code detector 210 the input selector 515 allows the address lines 510 of the decoder to be driven by the tree builder 310, Likewise, when the code detector 210 is receiving Huffman codes in a data stream, the input select module 515 allows the address lines 510 of the code detector 210 to be driven by the shifter 110, The terms "access" and "driven," as used herein, are used generally to describe a transfer of information and may include receiving data, requesting and receiving data, reading data from another device, and/or any other method of transferring data.

In another embodiment, the RAM of the code detector 210 is dual-ported, such that there are separate address inputs for reading and writing to the RAM. A read port may include a read address input and a data output, and a write port may include a write address input, a write-enable input, and a data input, for example. Accordingly, in this embodiment there is no need for the input select module 515, By removing the need for a select module 515, the use of a dual-ported RAM may advantageously decrease the time required for the critical loop.

The tree builder 310 is also coupled to a read/write input 525 and multiple data lines 530 of the code detector 210, The data lines 530 are used by the tree builder 310 to write the result data from the decode trees to the memory of the code detector 210, Thus, the number of data lines 530 used by a particular code detector 210 depends on the size of the memory to be accessed in the code detector 210, The read/write input 525, which may also be a write enable, sets the decoder to write data from the data lines 530 when the tree builder 310 is writing decode trees, in the form of result data, to the code detector 210, Likewise, the read/write input 525 sets the code detector 210 to ignore inputs on the data lines 530 when the variable length codes are being decoded according to the decode tree already stored in the code detector 210, In the embodiment of FIG. 6, a tree select module 520 is coupled to an input of the code detector 210, The tree select module 520 comprises logic that determines which tree should be accessed in the code detector 210, For example, a single code detector 210 may be written with two different Huffman trees, such as a Literal/Length/EOB Huffman tree and a Distance Huffman tree. Thus, when decoding a Huffman code, the code detector 210 determines which tree to access according to the input from the tree select module 520, In one embodiment, the tree select module 520 determines which Huffman tree should be used next based on the type of code which was previously decoded. For example, in DEFLATE, a Length code is followed by a Distance code, whereas a Literal Byte code is followed by a Length/Literal/EOB code, although Length and Literal Byte codes come from the same tree. Thus, in one embodiment, the tree select module 520 determines that a Distance tree stored in one or more code detectors 210 is to be used immediately after a length code is decoded. In one embodiment, the tree select module 520 is coupled to the most significant bit of the address lines 510, Accordingly, when the output of the tree select module 520 is changed the addresses accessed in the code detector 210 are changed. In one embodiment, the tree select module 520 is not used. For example, if a variable length coding scheme uses only a single decode tree in each code detector 210, a tree select module 520 may not be necessary. Also, within a particular decoder architecture including multiple decoders 210, such as in FIG. 5, for example, the output of the tree select module 520 may not be coupled to each of the decoders 210, For example, one or more of the decoders 210 in FIG. 5 may have only one decode tree stored in the memory, such as a Literal/Length/EOB tree, and therefore not require an input from the tree select module 520, Possible Result Suppression In one embodiment, code detector 210D (see Table 1, above) is assigned to Huffman codes of length 11-13 from the Length/Literal/EOB tree, but not to any Distance codes. Because the code detector 210D is written with only the Length/Literal/EOB tree, the output of code detector 210D does not need an address bit to select between trees. However, when a Distance code is being detected (by another code detector 210), a mechanism is needed to suppress code detection by code detector 210D, so that code detector 210D does not produce result data for a Length/Literal/EOB code that happens to correspond with the data window 114, Suppression of an output from a code detector 210, such as code detector 210D, may be performed in various ways known in the art. For example, code detector 210D may have an output register that can set the possible result output 212D to the null value each time a Distance codes is being detected. Alternatively, the output of the code detector 210D could be gated to a null value in Distance code cycles. In one embodiment, each code detector 210 that does not have sufficient address bits to select different memory regions for every tree type should have its output suppressed to the null value during cycles in which a code is expected from a Huffman tree that the code detector 210 does not support.

Suppression of possible results from certain code detectors 210 may also be used for long Huffman codes in certain coding schemes. Suppose, for example, that a code detector 210, such as code detector 210E, is needed to detect up to 15-bit codes. This appears to mean its RAM needs at least 15 address bits, or 16 address bits if an extra bit is allowed to select between two Huffman Trees. Such a RAM would have 65,556 memory locations. In some applications, that would be prohibitively large. Furthermore, all this memory would be very poorly utilized, considering that DEFLATE, for example, allows a total of no more than 315 Length/Literal/EOB and Distance codes.

Many Huffman coding schemes, however, place various restrictions on construction of Huffman codes in order to minimize the space needed to describe the Huffman codes in a compressed file. More particularly, according to the restrictions of certain Huffman coding schemes, a 15 bit code may be decoded by analyzing only the last M bits of the Huffman code, where M is less than the length L of the Huffman code. Accordingly, the size of the RAM in the code detectors 210 may be reduced if this restriction is understood and utilized.

While the above-described restriction typically has less value for short bit length Huffman codes, memory size may be greatly reduced for code detectors 210 detecting long bit-length Huffman codes. With specific reference to DEFLATE, for example, whenever a Length/Literal/EOB code is greater than 9 bits long (L>9), the first (L−9) bits will always be '1', and likewise whenever a Distance code is greater than 5 bits long (L>5), the first (L−5) bits will always be '1'. Thus, for a 15-bit Distance code the first 15−5=10 bits will always be '1' such that the Distance code is of the form "1111111111?????". Typically, the 'first' bits are defined as the bits appearing first in the input stream 112 and are the least significant bits of the data window 114 when a Huffman code begins at W[0].

Thus, in taking advantage of the above-described restriction, code detector 210E (See Table 1) does not need to use all 15 bits W[14:0] to address its RAM, but only the last 10 bits W[14:5]. More specifically, 10 bits are needed because code detector 210E is responsible for both 14 and 15 bit codes, where 14 bit codes can have the 9 bits 13:5 non-one and 15-bit codes can have the 9 bits 14:6 non-one, so for both we must allow for the 10 bits 14:5 to be non-one. The balance, W[4:0], need only be examined to check if all its bits are '1's or not. If any of the bits W[4:0] are not '1' then a Huffman code of a length that code detector 210E is responsible for could not possibly be present on W[14:0]. Thus, inexpensive logic may be incorporated to suppress the output of the code detector 210E or set the possible result of the code detector 210E to the null value. When using code detector 210E as defined in Table 1, if the first 5 leading bits, where "leading bits" are the first bits in a data window 114, are not '1's then the output of the code detector 210E may be suppressed. Similar to the suppression described above, the output of a code detector 210 may be suppressed in various ways, including resetting an output register coupled to the output of the code detectors 210 to a null value. In one embodiment, the output of a logical ANDing of the leading bits is stored in a register in parallel with the code detector 210 lookup. A multiplexer, or other logic, may then use the registered value to select between the code detector 210 output (a possible result) and the null value. Table 2, below, illustrates an exemplary arrangement of code detectors, including the necessary address bits of the data window, the assumed '1's for each code detector, and the total number of address bits required for each code detector. As seen in Table 2, the maximum number of address bits required for decoding up to a 15 bit Huffman code is 11, In contrast, a conventional Huffman decoder requires 16 address bits to decode 15 bit Huffman codes using 2 Huffman trees, where the 15 address bits are received from the data window and 1 bit is used for tree selection. Thus, recognizing and utilizing the assumed '1's in longer Huffman codes decreases the memory size necessary in the code detectors 210,

TABLE 2

| Code detector 210 | Literal/Length/EOB Code Lengths | Distance Code Lengths | Tree Selection Address Bit | data window 114 Address Bits | data window 114 Assumed '1's | Total Number of Address Bits |
|---|---|---|---|---|---|---|
| 1. (210a) | 1-5 | 1-5 | Yes | 4:0 | — | 6 |
| 2. (210b) | 6-8 | 6-8 | Yes | 7:0 | — | 9 |
| 3. (210c) | 9-10 | 9-10 | Yes | 9:0 | — | 11 |
| 4. (210d) | 11-13 | None | No | 12:2 | 1:0 | 11 |
| 5. (210e) | 14-15 | 11-15 | Yes | 14:5 | 4:0 | 11 |

In general, if a compression scheme restricts its dynamic Huffman trees similarly to DEFLATE (e.g., trees must be complete and codes must be lexicographically ordered according to length), and there are a maximum of N codes possible in a single tree, then only the last CEILING(LOG2 (N)) bits of codes of a given length can vary. The balance will always be either all '1's or all '0's, and the above scheme may be applied.

The above displayed code detector configuration (Table 2) is exemplary of one configuration of code detectors 210, Any other configuration of code detectors 210 may be implemented according to the methods and techniques described herein. There may be several items to consider in assigning various Huffman code lengths and trees to various code detectors 210, In one embodiment, a design has a separate code detector 210 for every Huffman code length and tree type. In another embodiment, a single code detector 210 stores result data for Huffman codes of all lengths. In an advantageous embodiment, multiple code detectors 210 are implemented such that certain code detectors detect ranges of Huffman code lengths and more than one tree type. In determining the number of code detectors 210 to use in any given decoding situation, the following items should be considered:

1) Assigning fewer code lengths and types to each code detector 210 may result in large amounts of memory resources in the code detectors 210 not being used. In addition, because there may be greater numbers of code detectors 210, the system may exhibit long routing delays to and from distantly spaced code detectors 210 and combining logic.

2) Assigning a wider range of code lengths to a single code detector 210 necessitates more address bits on that code detector 210, Thus, the code detector 210 may become large and underutilized.

3) Assigning a wider a range of code lengths to a single code detector 210 geometrically increases the number of redundant locations to which the shorter code lengths must be written by the tree builder 310, thus increasing the time required to prepare the code detector 210 with data from the Huffman Trees before actual decoding begins.

4) Relying on "assumed '1's" (or '0's) allows less address bits on a code detector 210 for long code-lengths.

5) Sharing a code detector 210 for multiple code lengths reduces the number of '1's that may be assumed.

6) Sharing a code detector 210 among multiple trees adds the need for one or more additional address bits to select between the multiple trees.

7) Because trees of different maximum code lengths or populations allow for different numbers of assumed '1's, there can be profitable pairings of varying length ranges for different tree types. For example, see code detector 210E in Table 2.

8) Different code lengths see different amounts of usage. Thus, assigning common code lengths to code detectors 210 that are responsible for decoding codes of a maximum length equal to, or close to, the common code lengths reduces the number of times the tree builder 310 is required to write the corresponding result data to the code detectors 210, When a code length is infrequently used, this is less important.

be assigned to code detector 210 #5, thus freeing code detector 210 #4 from the need for a tree-selection address bit.

Table 3, below, illustrates another exemplary configuration of code detectors 210 in a decoder 130, In the exemplary configuration in Table 3, the code detectors 210 are configured to decode variable length codes of different length ranges than those discussed above with respect to Table 2. Additionally, code detectors 1 and 2 each include a Fixed Tree that may be addressed with a Fixed Tree Selection Bit. In the exemplary configuration of Table 3, the Fixed Tree in code detector 1 stores 5 bit distance codes and the fixed tree in code detector 2 stores 7 to 9 bit Length/Literal/EOB codes. It is contemplated that any type of tree for any bit length variable length code may be stored and accessed in one or more fixed trees.

TABLE 3

| Code detector 210 | Literal/ Length/ EOB Code Lengths | Distance Code Lengths | Fixed Tree | Length/ Distance Tree Selection Bit | Fixed tree Selection Bit | data window 114 Address Bits | data window 114 Assumed '1's | Total Number of Address Bits |
|---|---|---|---|---|---|---|---|---|
| 1. | 0-6 | 0-6 | 5 bit distance codes | 1 | 1 | 5:0 | — | 8 |
| 2. | 7-9 | None | 7-9 bit Length/ Literal/ EOB codes | 0 | 1 | 8:0 | — | 10 |
| 3. | 10-11 | 7-11 | None | 1 | 0 | 10:1 | bit 0 | 11 |
| 4. | 12-14 | None | None | 0 | 0 | 13:3 | 2:0 | 11 |
| 5. | 15-16 | 12-16 | None | 1 | 0 | 15:6 | 5:0 | 11 |

In an exemplary embodiment, a single FPGA's, such as the Virtex-II FPGA manufactured by Xilinx, may include each of the code detectors 210, The Virtex-II, for example, has multiple block-RAM resources of 18,432 bits in size, which can be configured to various widths and depths. Thus, at the narrowest width of 18 bits, which accommodates an exemplary 18 bit result data, a block-RAM is 1024 bits deep and is addressable by 10 address bits. Accordingly, both of the code detectors 210A and 210B (Table 2) may be implemented using a single block-RAM. However, two block-RAMs, each configured with 11 address bits and 9 data bits, are combined in order to address each of the code detectors 210C, 210D, 210E.

The configuration of code detectors 210 as illustrated in Table 2 was selected in view of the above listed considerations and the following implementation realizations:

1) Using more than 5 code detectors 210 may decrease efficiency due to long routing delays to and from the RAMs 2) Using fewer than 5 code detectors 210 may decrease efficiency due to the large amount of overhead required by the tree builder 310 in writing result data in redundant locations, due to the broad code length ranges that share a single RAM 3) The frequent use of 8-bit literal byte codes and 5-bit Distance codes encouraged the placement of these two lengths at the upper limit of their respective code detectors 210A and 210B

4) The infrequent use of very long Distance codes allowed the relatively wide range of 11 to 15-bit Distance codes to The above examples and associated implementation realizations are provided to illustrate exemplary implementation designs for a variable length code decoder having a plurality of code detectors 210, In addition, the use of any type of memory device, and any configuration of memory devices, is expressly contemplated. For example, the code detectors 210 may be implemented in a Xilinx Virtex-II FPGA, an ASIC, or any other programmable logic device. Other modifications that are expressly contemplated include: a different number of code detectors 210, a different mapping of Huffman code lengths and trees to code detectors 210, different sizes of RAMs in code detectors 210, use of single-ported or dual-ported RAMs in code detectors 210, different pipelining of the critical loop or other logic, different methods of suppressing code detector 210 output, use of ROM or specialized logic to decode fixed-tree Huffman codes, different width of the data window 114, separate shifting of Huffman codes and extra-bits, shifting long fields in multiple steps, insertion of some bit-masking logic between the data window 114 and the RAMS of the code detectors 210, in particular modes or states, forcing the use of certain memory regions or preventing memory accesses based on certain bits of the data window 114, and generalization to support additional compressed formats, such as RAR and/or LZH. Accordingly, the above described exemplary configuration is not necessarily the best implementation for all applications. Various embodiments may use more code detectors 210, such as 6, 7, 8, 10,12, 15, or 20, for example, and have RAMS of the code detectors 210 with various data widths, such as 2, 4, 8, 12, 16, 18, 20, 24, 32, 64 or 128 bits, for example. Also, the assignment of specific lengths, or ranges of lengths, of Huffman codes to each particular code detector may be application specific such that each code detector is responsible for decoding Huffman codes of a smaller or larger range of bit lengths.

Figure 7:
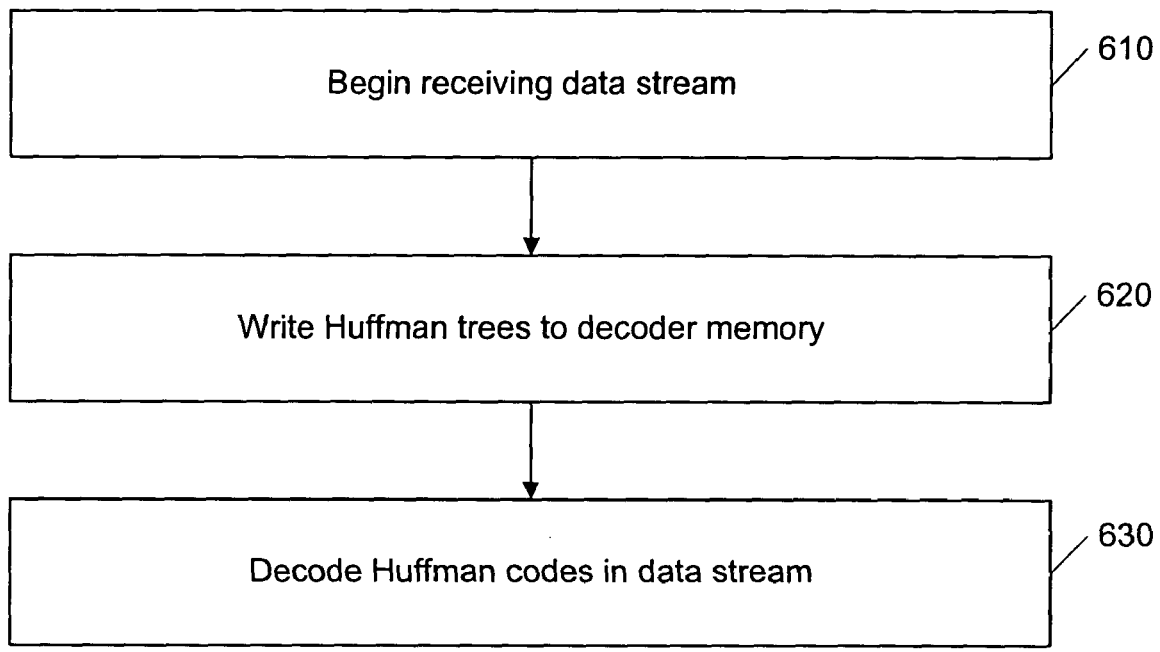
FIG. 7 is a flow chart illustrating the overall process of decoding a Huffman coded data stream.

FIG. 7 is a flow chart illustrating the overall process of decoding a Huffman coded data stream. In block 610 the first bits of a data stream are received by a Huffman decoding system. In one embodiment, the data stream is received initially by a shifter 110 which presents a data window 114 to other decode devices.

In block 620 the Huffman trees, or other decode trees, are written to the memories of the code detectors. In one embodiment, the Huffman tree is received at the beginning of a Huffman coded data stream. Thus, the beginning of the data stream is accessed by a tree building device, such as tree builder 310, to fill the memories of the code detectors 210 with the appropriate Huffman trees. Alternatively, the Huffman trees may be received from another source or read from another memory device. In this embodiment, the Huffman trees may be written to the memories of the code detectors 210 before the data stream is received. In either case, block 620 ensures that the memories of the code detectors 210 contain the proper information for decode of received Huffman codes in the data stream.

In block 630 Huffman codes in the data stream are decoded resulting in a decoded output. In certain cases, such as literal Huffman coding, the output of the decoding operation comprises the decoded Huffman code. In other cases, such as Length/Distance codes, the output of the decoding operation indicates where subsequent decoded Huffman codes may be copied from in the already received data stream.

Figure 8:
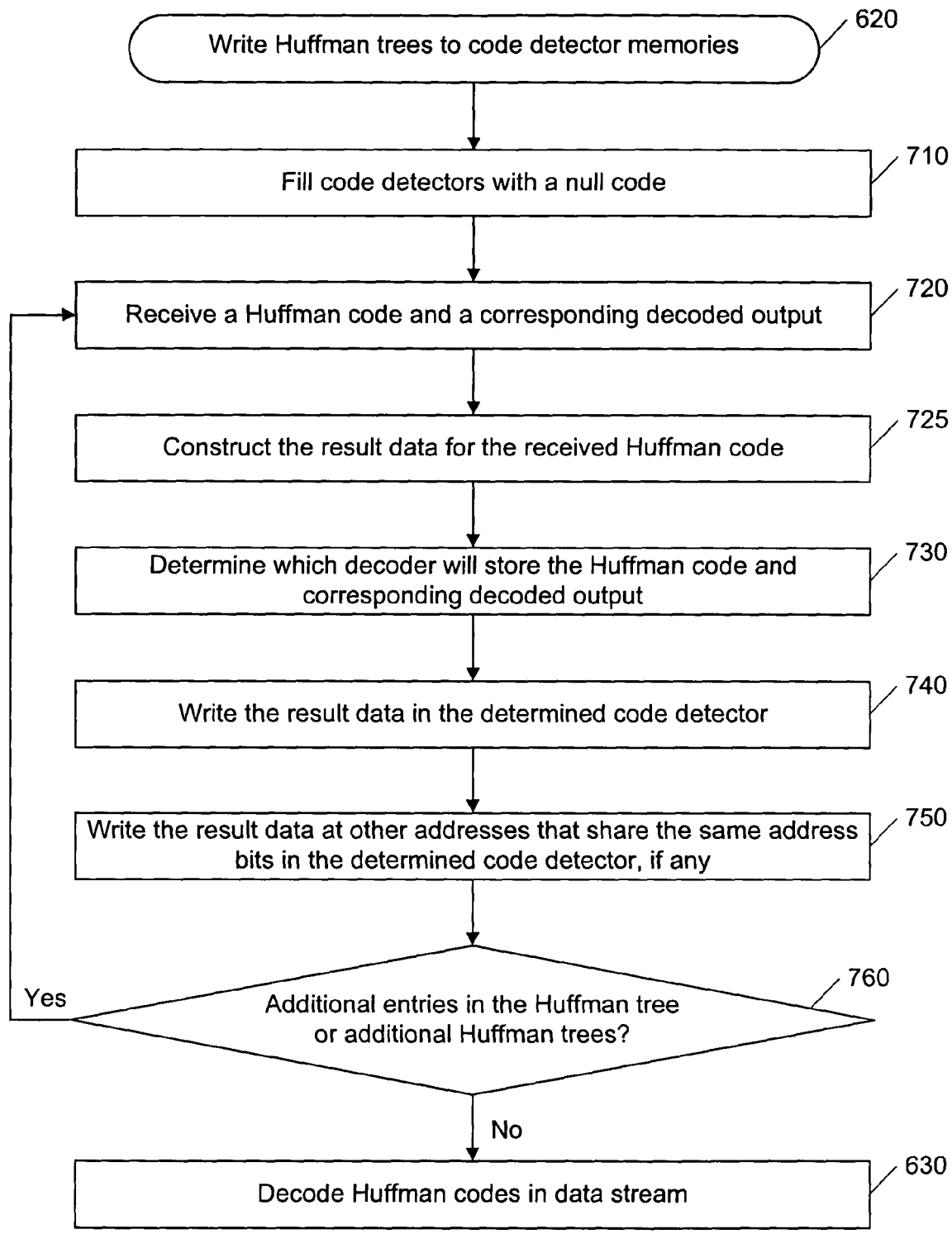
FIG. 8 is a flow chart illustrating the process of writing a Huffman tree to the code detector memories.

FIG. 8 is a flow chart illustrating the process of writing a Huffman tree to the code detector memories (block 620 of FIG. 7). In one embodiment, the process illustrated in FIG. 8 is performed, at least in part, by the tree builder 310, In block 710 each of the code detectors 210 are filled with a null code at every address. In one embodiment, before decode information is written to the code detectors 210, each of the code detectors 210 is filled with a predetermined null code. In one embodiment, the null code is output by a code detector 210 when the code detector is not responsible for decoding the particular Huffman code starting at bit zero in the current data window. By pre-filling each of the code detectors 210 with the null code, all but one of the code detectors will output the null code as the possible result, and the actual result, or result data, will be detectable. In another embodiment, rather than writing the null code to every address of the code detectors 210, the null code may be written to those memory locations that previously stored decode information, such as Huffman trees, used in a previous decode operation.

In block 720 a Huffman code and a corresponding decoded output is received. For example, a 3 bit Huffman code may represent the symbol 'A', or an ASCII code representing the letter 'A', as determined by the device that initially prepared the Huffman tree. Thus, the 3 bit Huffman code and the corresponding symbol 'A' are received by the tree builder 310, One of skill in the art will recognize that transmission of a Huffman tree may be performed in any number of ways. In one embodiment, one or more dynamic or fixed Huffman trees are received in the data stream 112, or alternatively, from the shifter 110 (as in FIG. 4 and 4). Alternatively, decode trees may be stored permanently in dedicated portions of one or more code detectors 210 and additional address bit(s) may be used to select the permanently stored decode trees. For example, some Huffman coding protocols, such as DEFLATE, define sets of fixed Huffman trees in addition to allowing dynamic trees. The tree builder 310 may reduce the time required to store the fixed trees in the code detectors 210 by storing the fixed trees permanently in the appropriate code detectors 210, Alternatively, decode trees, such as fixed trees, could be stored in one or more separate memory structures (such as RAM or ROM). In one embodiment, exemplary code detector 210b of Table 2 includes an additional address bit to select a dedicated region containing all, or most of, the fixed decode tree for 6-8 bit Literal/Length/EOB and Distance codes.

In block 725 result data is constructed for the received Huffman code. In one embodiment, the result data comprises the decoded symbol. For example, the three bit Huffman code "010" may correspond to the symbol 'A' such that when the bit stream contains the bits "010", starting at W[0], the result data may comprise the symbol 'A'. In another embodiment, the result data comprises additional data related to the coded data. Table 4, below, is an exemplary arrangement of data bits for result data. As shown in Table 4, the arrangement of data bits may vary depending on the type of data (e.g., Literal, Length/Distance, End Of Block data) that is being coded.

TABLE 4

| | 17 (E) | 16 (A) | 15 | 14 | 13 | 12 | 11 | 10 | 9 | 8 | 7 | 6 | 5 | 4 | 3 | 2 | 1 | 0 |
|---|---|---|---|---|---|---|---|---|---|---|---|---|---|---|---|---|---|---|
| No Valid Code | 0 | 0 | 0 | 0 | 0 | 0 | 0 | 0 | 0 | 0 | 0 | 0 | 0 | 1 | 1 | 1 | 1 | 1 |
| Literal Byte | 0 | 1 | | | | | F | | | | 0 | 0 | 0 | | | B | | |
| Length/Distance | 1 | 1 | | C | | | | B | | | | G | | | D | | | |
| EOB | 0 | 1 | 0 | 0 | 0 | 0 | 0 | 0 | 0 | 0 | 0 | 0 | 1 | | | B | | |

The letters in the above exemplary result data arrangement table represent different types of data associated with the data to be coded, as follows:

A. Valid flag
B. Length of the Huffman code
C. Number of extra bits associated with the Huffman code
D. The total length of the Huffman code and its associated extra-bits field (the sum of the Huffman code length (B) and the length of the extra bits (C))
E. The type of symbol that was coded, e.g. Length/Distance vs. Literal Byte/EOB
F. An index of the specific symbol which was Huffman-coded, e.g. 0-255 for a literal byte
G. A binary field that, when appended to any associated extra-bits, yields an exact net value, e.g. an exact length or Distance Lempel-Ziv value In the exemplary result data configuration of Table 4, each result data stored in a code detector 210 has an 18 bit fixed length and the result data is formatted differently depending on the type of Huffman code. In one embodiment, additional data is included in the result data. In one embodiment, field E comprises 2 bits such that 4 different code types may be individually identified. In another embodiment, the result data is used to access another memory device to retrieve further result data. In this embodiment, the length of the result data output by the decoder 130 may be reduced, to 9 bits, for example, and additional data may be retrieved from another memory device. In another embodiment, the result data does not include each of the above described data elements A-G. For example, in one embodiment the result data may include only fields B and E, indicating the length of the Huffman code and an index of the symbol which was coded, respectively. In other embodiments, the result data may include only field B, indicating the length of the Huffman code or, alternatively, the result data may include only field D, indicating the total length of the Huffman code and the extra bits field. In one embodiment, the length of the result data is fixed, as in the above example of Table 4, such that each item of additional information included in the result data, such as the length of the Huffman code, is in a known position in the result data. In another embodiment, the length of the result data is variable.

In block 730 the tree builder 310 determines which of the code detectors 210 will store the result data. In an advantageous embodiment, each code detectors 210 stores the result data of Huffman codes of a determined bit length, or range of lengths. For example, a first decoder may store the result data for all Huffman codes of length 1-4 bits while a second decoder stores the result data for all Huffman codes of length 5-8, The tree builder 310 determines the length of the received Huffman code and, accordingly, determines which code detector 210 should store the result data.

In block 740 the result data is written to the determined code detector 210, In one embodiment, the result data is written to the determined code detector 210 at the address of the Huffman code. For example, if a received Huffman code is 6 bits long, the tree builder 310 may determine that the result data corresponding to the 6 bit Huffman code be written to a code detector 210 assigned to decoded Huffman codes of length 5-8, Accordingly, the result data may be written to the selected code detector 210 at the address of the Huffman code. More particularly, if the 6 bit Huffman code is '100100', the generated result data would be stored at the memory address '100100' of the selected code detector. As discussed above, in one embodiment the result data includes an indication of the length of the Huffman code (so that the length of the Huffman code may be quickly extracted from the code detector output and the data window may be shifted immediately, for example). Additionally, the result data may include information such as a valid flag or a number of extra-bits, for example.

In block 750, the result data is stored at other memory locations in the selected code detector 210, if the Huffman code is less than the length of the longest Huffman code for which the selected code detector 210 is responsible. For example, if the 6 bit Huffman code '100100' is stored in a code detector that is responsible for decoding Huffman codes of lengths from 5-8 bits, the result data may be stored at three additional addresses in the code detector. In a code detector 210 that is responsible for decoding Huffman codes of lengths up to 8 bits, the code detector 210 will have eight address bits. Thus, when a 6 bit Huffman code is received, only 6 of the 8 address lines of the code detector 210 are relevant to the Huffman code. The remaining 2 address lines contain unknown data, such as the first two bits of a subsequent Huffman code. Accordingly, all possible combinations of the remaining 2 bits should be written with the same result data. Therefore, the additional addresses '00 100100', '01 100100', '10 100100', and '11 100100' will stored the result data also. In this way, the a code detector 210 accurately outputs the proper result data for a Huffman code that is shorter than the longest Huffman code length for which the code detector 210 is responsible, independent of the additional bits.

In block 760 the tree builder 310 determines if additional Huffman codes or additional Huffman trees are to be received in the current data stream. If additional Huffman codes are present in the data steam, the method returns to block 720 where the next Huffman code and corresponding decoded output are received. In one embodiment, the data stream may contain the number of codes in each tree before the actual tree data so that the tree builder 310 knows when the tree has been completely received. In another embodiment, a known value may appear after all tree entries in the data stream, thus indicating that all trees have been received by the tree builder 310, After all of the Huffman codes in each of the Huffman trees are written to the code detectors 210, as described above, the method continues and begins decoding of the Huffman codes in the data stream, as described in FIG. 9.

Figure 9:
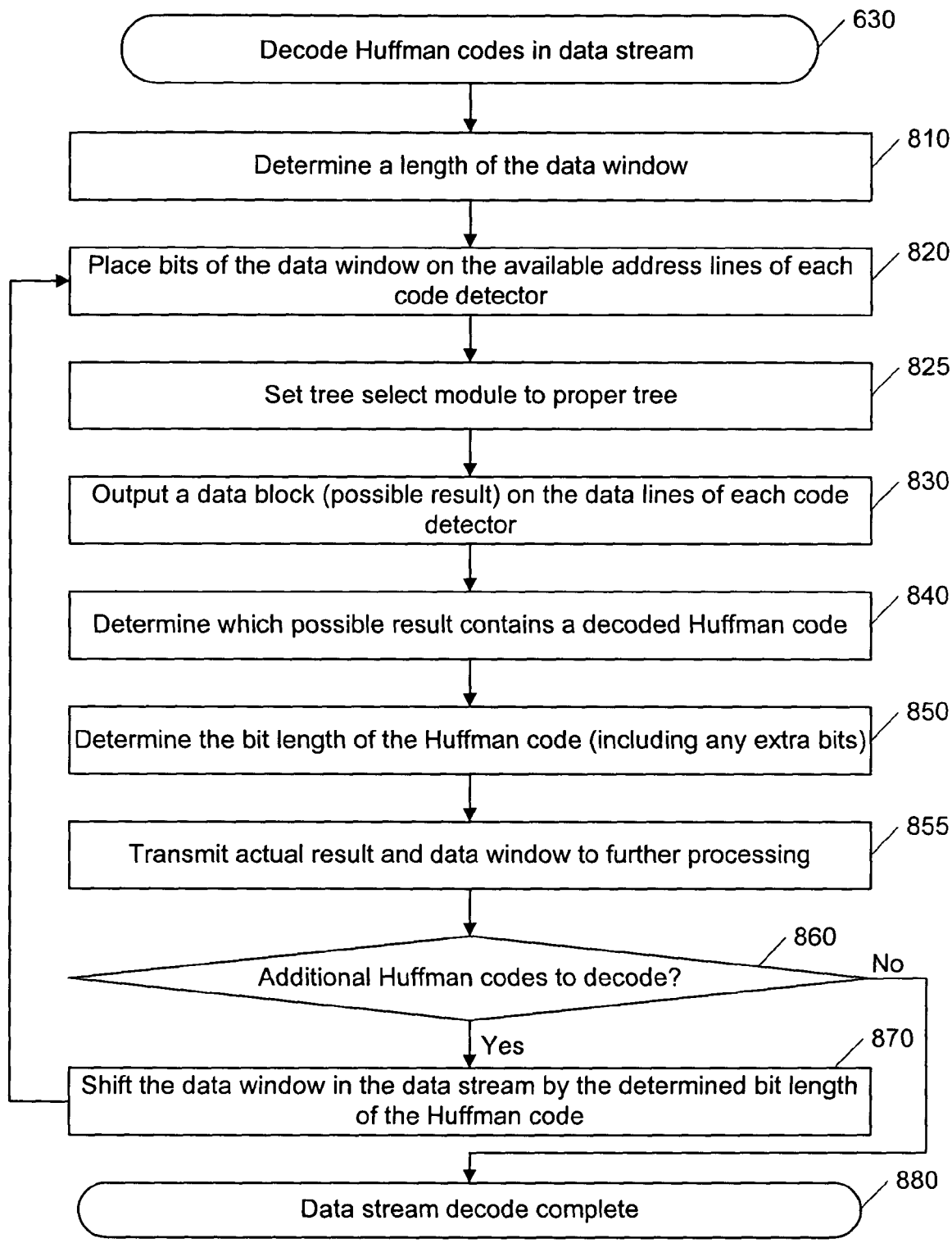
FIG. 9 is a flow chart illustrating the process of decoding Huffman codes in a data stream.

FIG. 9 is a flow chart illustrating the process of decoding Huffman codes in a data stream. In the exemplary embodiment described below, the decoding process is performed by at least a combination of the shifter 110, the plurality of code detectors 210, and the select module 220, In block 810 a length for the data window 114 is set. The data window is a predetermined number of bits of the data stream that is placed on the address lines of each of the code detectors 210, In one embodiment, the length of the data window 114 is set at the design time of the decoder 130 such that the length of the data window 114 is constant for all jobs received by the decoder 130, In one embodiment, the length of the data widow 114 is set equal to the bit length of the longest Huffman code. For example, in a system that decoded up to 15 bit Huffman codes, the length of the data window 114 is set to 15 bits. In another embodiment, the length of the data window 114 is set to a length that is greater than the bit length of the longest Huffman code. For example, in one embodiment, the length of the data window 114 is at least as long as the longest Huffman code plus the longest extra-bits field, which is, for example, 15+13=28 for DEFLATE. In another embodiment, the length of the data window 114 is greater than the length of the longest Huffman code so that headers and non-compressed data blocks may be bypassed.

In block 820, the data window 114 is output to the available address lines of each code detector 210, In one embodiment, not all bits of a data window 114 will be output to every code detector 210, For example, if a particular code detector 210 is responsible for decoding Huffman codes of length 1-4 bits, the code detector 210 requires the use of only 4 address lines, and possibly a fifth address line for a tree select module 520 output. Thus, bits in excess of 4 from the data window 114 are not received by the 1-4 bit length code detector 210, However, a code detector 210 that is responsible for decoding Huffman codes of length 14-15 may require the use of all 15 address lines (ignoring the suppression of leading bits as discussed earlier) so that 15 bit Huffman codes may be accurately decoded.

In block 825, the tree select module 520 (FIG. 6) outputs a signal to code detectors 210 that store more than one decode tree, where the output indicates which tree to use for the current decode operation. For example, the output of the tree select module 520 may be a single bit that toggles between one (1) indicating use of the Distance tree and zero (0) indicating use of the Literal/Length/EOB tree. As discussed above, the output of the tree select module 520 may not be necessary for a code detector 210 that stores a single decode tree.

In block 830, each of the code detectors 210 output a possible result, where the possible result is the result data stored at the address specified on the address lines 510 by the data window 114, As described above with respect to FIG. 8, the result data, which may include many data items, including the decoded Huffman code, the Huffman code length, the length of extra bits, and the sum of the Huffman code length and the length of extra bits, for example, is stored at the address of the Huffman code in a single code detector 210, Thus, when decoding a 6 bit Huffman code, for example, the output of a code detector 210 that is responsible for decoding Huffman codes of length 6-8 bits will output a possible result that comprises the result data. The other code detectors 210, for example, code detectors 210 responsible for decoding Huffman codes of length 1-5, 9-10, 11-13, and 14-15, will output a null code.

In one embodiment, the address accessed at one or more of the code detectors 210 includes one bit received from the tree select module 520, Thus, if a particular code detector 210 stores both a Length/literal/EOB decode tree and a Distance decode tree, the output from the tree select module 520 may be output to one of the address lines on the particular code detector 210, For example, result data for a six bit Huffman code representing a length or literal symbol may be stored at the address '0 110110' while result data for the same six bit Huffman code representing a distance symbol may be stored at the address '1 110110' where the first bit (the most significant bit) indicates the use of a different tree stored in the particular code detector. Thus, in one embodiment, multiple decode trees in a single code detector 210 may be implemented using a single additional address line.

In block 840, each of the possible results from the code detectors 210 are received by the select module, which determines which of the possible results contains the result data (the possible result that contains the result data is also referred to as the actual result). In one embodiment, the null code is set to a combination of bits such that all of the possible results may be logically ANDed, or alternatively ORed, together to determine the actual result. In another embodiment, the null code is a predetermined bit pattern so that the select module may easily determine that the actual result is the possible result not matching the predetermined bit pattern. In yet another embodiment, a specified bit of the possible result is used as a flag which indicates whether or not the possible result contains the result data. Additionally, one of skill in the art will recognize that many other methods of determining the actual result from a plurality of possible results are possible.

In block 850, the bit length of the Huffman code and any extra bits is determined. In one embodiment, the select module 220 determines the length of the Huffman code plus any extra bits by reading predetermined bits in the result data that indicate the lengths. In another embodiment, the select module determines the length of the Huffman code, the length of extra bits, and the total length of the Huffman code plus extra bits by analyzing the content of the result data.

In block 855, the actual result and the data window 114 are transmitted to a further processing module 240 (See FIG. 3, for example). The further processing module 240 may perform multiple operations on the actual result and the data window 114 in the generation of a decoded result. In an advantageous embodiment, the further processing module 240 outputs a decoded result data stream that is identical to the data stream from which the Huffman coded data stream was created. Thus, in one embodiment, the further processing extracts the literal byte data bits from the result data. The further processing module 240 may also locate the beginning and end of the extra-bits field within W. For example, if the actual result indicates a Huffman code length of 12 bits and an extra-bits length of 8 bits, then the extra-bits field associated with the detected Huffman code is in W[19:12]. This extra-bits field can be appended or added to other data in, or derived from, the actual result to produce, for example, the exact Lempel-Ziv length or distance that was coded, which may be part of the decoded output.

In block 860, the method determines if there are additional Huffman codes to be decoded. In one embodiment, the select module 220 determines that no additional Huffman codes are ready for decode after an End Of Block (EOB) decoded result is received. In another embodiment, the number of symbols coded precedes the Huffman codes, so the decoder may determine that all Huffman codes in the data stream have been decoded by counting the number of decoded Huffman codes. If additional Huffman codes remain in the current data stream the method continues to block 870 where the data window 114 is shifted. If no additional Huffman codes remain in the current data stream, or if new Huffman trees are to be written to one or more code detectors 210, the method continues to block 880 and the current data decode operation is complete. After the decode operation is complete in block 880, the method may restart again in block 610 with the reception of another stream of data.

In block 870, the data window 114 is shifted by the determined bit-length of the Huffman code plus the length of any extra bits. In one embodiment, a shift length is transmitted from the select module 220 to the shifter 110, The shift length may comprise, for example, the length of the just-decoded Huffman code or alternatively, the length of the just-decoded Huffman code minus one, depending on the shifter 110 specifications. For example, after a six bit Huffman code '100100' has been decoded, the shifter 110, in response to the receipt of the shift length, shifts the data window 114 by six bits, removing the just-decoded six bit Huffman code '100100' and adding an additional six bits from the data stream in order to maintain the constant size of the data window 114, In one embodiment, if extra bits are indicated in the result data, the data window 114 is shifted by the sum of the length of the Huffman code plus the length of the extra bits. In this way, a single shift operation removes all bits associated with a Length/Distance code having extra bits. In one embodiment, the Length/Distance code and the extra bits are output to further processing where the Length/Distance code and the extra bits may be analyzed and the represented symbols may be retrieved from the proper location in the already decoded symbols.

The term "module," as used herein, means, but is not limited to, a software or hardware component, such as a field programmable gate array (FPGA) or an application specific integrated circuit (ASIC), or a portion of logic in an FPGA or ASIC, which performs certain tasks. A module may advantageously be configured to reside on an addressable storage medium and configured to execute on one or more processors. Thus, a module may include, by way of example, components, such as software components, object-oriented software components, class components and task components, processes, functions, attributes, procedures, subroutines, segments of program code, drivers, firmware, microcode, circuitry, data, databases, data structures, tables, arrays, and variables. The functionality provided for in the components and modules may be combined into fewer components and modules or further separated into additional components and modules.

The foregoing description details certain embodiments of the invention. It will be appreciated, however, that no matter how detailed the foregoing appears in text, the invention can be practiced in many ways. As is also stated above, it should be noted that the use of particular terminology when describing certain features or aspects of the invention should not be taken to imply that the terminology is being re-defined herein to be restricted to including any specific characteristics of the features or aspects of the invention with which that terminology is associated. The scope of the invention should therefore be construed in accordance with the appended claims and any equivalents thereof.

What is claimed is:

1. A method of decoding a plurality of variable-length codewords in a stream of data bits, the method comprising:
   presenting at a plurality of code detectors a data window comprising a number of bits of said stream of data bits;
   reading data from each of a plurality of memories that are associated with respective code detectors, the data being read from different memory addresses of each memory, wherein each different memory address corresponds with a different, partially overlapping, portion of the data window;
   outputting a possible result from each of said plurality of code detectors, the possible results each comprising the data read from the code detector's respective memories; and
   determining which of said plurality of possible results comprises an actual result, wherein said actual result comprises a length of a codeword in said number of bits of said stream of data bits.

2. The method of claim 1, wherein said length of said codeword is a length of a variable-length codeword.

3. The method of claim 1, wherein said length of said codeword is a length of a variable-length codeword and associated extra bits.

4. The method of claim 1, wherein each of said plurality of memories comprises a Random Access Memory (RAM).

5. The method of claim 1, wherein a Field Programmable Gate Array (FPGA) comprises one or more of said plurality of memories.

6. The method of claim 1, further comprising:
   shifting said data window by said length of said codeword; and
   repeating said steps of presenting, reading, outputting, determining, and shifting.

7. The method of claim 1, wherein said number of bits of said stream of data bits is greater than or equal to a longest possible codeword length.

8. The method of claim 1, wherein one or more of said variable-length codewords comprises a Huffman code.

9. The method of claim 1, wherein one or more of said variable-length codewords comprises a distance code.

10. The method of claim 1, wherein one or more of said variable-length codewords comprises a length code.

11. The method of claim 1, wherein one or more of said variable-length codewords comprises a Lempel-Ziv code.

12. The method of claim 1, wherein one or more of said variable-length data blocks comprises extra bits.

13. The method of claim 1, further comprising:
   receiving a codeword and a corresponding decoded code; and
   writing said decoded code to one of said plurality of memory devices at an address corresponding to said codeword.

14. The method of claim 13, further comprising writing a null code at said address corresponding to said codeword after each of said plurality of variable length codewords has been presented at said plurality of code detectors.

15. The method of claim 1, wherein at least one of said plurality of memory devices stores two or more decode trees.

16. The method of claim 1, wherein a first of said plurality of code detectors is configured to decode codewords comprising from 1 to 5 bits.

17. The method of claim 16, wherein a second of said plurality of code detectors is configured to decode codewords comprising from 6 to 8 bits.

18. The method of claim 17, wherein a third of said plurality of code detectors is configured to decode codewords comprising from 9 to 10 bits.

19. The method of claim 18, wherein a fourth of said plurality of code detectors is configured to decode codewords comprising from 11 to 13 bits.

20. The method of claim 19, wherein a fifth of said plurality of code detectors is configured to decode codewords comprising from 14 to 15 bits.

21. The method of claim 1, wherein said codewords comprise at least one of: GZIP, PKZIP, DEFLATE, LZH and RAR encoded data.

22. The method of claim 1, wherein each of said addresses comprises one or more bits of said data window.

23. A system for determining a plurality of lengths corresponding to a plurality of Huffman codes in a received bitstream, the system comprising:
   a first code detector configured to access exactly N bits of said bitstream, wherein said first code detector is configured to decode Huffman codes having a first range of bit lengths;
   a second code detector configured to access more than N bits of said bitstream, wherein said second code detector is configured to decode Huffman codes having a second range of bit lengths, the second range comprising bit lengths that are not included in the first range, and wherein the decoding operations performed by the first code detector and the second code detector are in response to at least the same N bits of the bitstream;
   a tree builder coupled to the first and second code detectors and configured to selectively write a plurality of decoded codewords to at least one of said first and second code detectors; and
   a select module coupled to said first and second code detectors and configured to receive a first output from said first code detector and a second output from said second code detector and determine which of said outputs corresponds with a Huffman code.

24. The system of claim 23, wherein said first range and said second range are mutually exclusive.

25. The system of claim 23, further comprising a shifter configured to receive a digital data stream comprising said plurality of Huffman codes and configured to make portions of said plurality of Huffman codes available for access by said first and second code detectors.

26. The system of claim 23, wherein said output that corresponds with said Huffman code comprises an indication of a length of said Huffman code.

27. The system of claim 23, wherein one of said outputs from said first and second code detectors comprises a valid flag indicating that said one of said outputs corresponds with a Huffman code.

28. The system of claim 23, wherein said output that corresponds with said Huffman code comprises an indication of a number of extra bits associated with said Huffman code.

29. The system of claim 23, wherein said output that corresponds with said Huffman code comprises an indication of a sum of a length of said Huffman code and a number of extra bits associated with said Huffman code.

30. The system of claim 23, wherein said output that corresponds with said Huffman code comprises an indication of a type of symbol that was coded.

31. The system of claim 23, wherein said output that corresponds with said Huffman code comprises a literal symbol.

32. An apparatus for decoding a variable length code comprising:
   a first memory storing a result data corresponding to a variable length code at a first address comprising a first number of bits in a data block; and
   a second memory storing a null code at a second address comprising a second number of bits in said data block, wherein said first address and said second address comprise one or more common bits in said data block,
   wherein a plurality of addresses in said first memory each store the result data, wherein said plurality of addresses are N bit addresses, said first address is a N-1 bit address, and N-1 bits of said first address and said plurality of addresses are equal.

33. The apparatus of claim 32, wherein said plurality of addresses comprises:
   addresses where a predetermined bit is set to one and said remaining N-1 bits are equal to said first address; and
   addresses where said predetermined bit is set to zero and said remaining N-1 bits are equal to said first address.

* * * * *

UNITED STATES PATENT AND TRADEMARK OFFICE
CERTIFICATE OF CORRECTION

| | | |
|---|---|---|
| PATENT NO. | : 7,283,591 B2 | Page 1 of 8 |
| APPLICATION NO. | : 10/637953 | |
| DATED | : October 16, 2007 | |
| INVENTOR(S) | : Michael D. Ruehle | |

It is certified that error appears in the above-identified patent and that said Letters Patent is hereby corrected as shown below:

Column 4

Line 62, please delete "1023," and insert therefore, --1023.--.

Column 5

Line 19, please delete "give" and insert therefore, --given--.

Column 8

Line 23, please delete "130," and insert therefore, --130.--.

Line 36, please delete "112," and insert therefore, --112.--.

Line 38, please delete "112," and insert therefore, --112.--.

Line 43, please delete "114," and insert therefore, --114.--.

Line 52, please delete "114," and insert therefore, --114.--.

Line 66, please delete "114," and insert therefore, --114.--.

Column 9

Line 2, please delete "130," and insert therefore, --130.--.

Line 6, please delete "112," and insert therefore, --112.--.

Line 13, please delete "112," and insert therefore, --112.--.

Line 29, please delete "110, The" and insert therefore, --110.  The--.

Line 32, please delete "114," and insert therefore, --114.--.

Line 34, please delete "114," and insert therefore, --114.--.

UNITED STATES PATENT AND TRADEMARK OFFICE
CERTIFICATE OF CORRECTION

PATENT NO. : 7,283,591 B2
APPLICATION NO. : 10/637953
DATED : October 16, 2007
INVENTOR(S) : Michael D. Ruehle It is certified that error appears in the above-identified patent and that said Letters Patent is hereby corrected as shown below:

Line 38, please delete "110," and insert therefore, --110.--.

Line 42, please delete "114," and insert therefore, --114.--.

Line 44, please delete "130," and insert therefore, --130.--.

Line 51, please delete "114," and insert therefore, --114.--.

Line 53, please delete "130," and insert therefore, --130.--.

Column 10

Line 17 (Approx.), please delete "114," and insert therefore, --114.--.

Line 21, please delete "120," and insert therefore, --120.--.

Line 22, please delete "110," and insert therefore, --110.--.

Line 38 (Approx.), please delete "114," and insert therefore, --114.--.

Line 47 (Approx.), please delete "114," and insert therefore, --114.--.

Column 11

Line 6, please delete "(210a)" and insert therefore, --(210A)--.

Line 7, please delete "(210b)" and insert therefore, --(210B)--.

Line 8, please delete "(210c)" and insert therefore, --(210C)--.

Line 9, please delete "(210d)" and insert therefore, --(210D)--.

Line 10 (Approx.), please delete "(210e)" and insert therefore, --(210E)--.

Line 14 (Approx.), please delete "114," and insert therefore, --114.--.

Line 26 (Approx.), please delete "134," and insert therefore, --134.--.

UNITED STATES PATENT AND TRADEMARK OFFICE
CERTIFICATE OF CORRECTION

PATENT NO. : 7,283,591 B2
APPLICATION NO. : 10/637953
DATED : October 16, 2007
INVENTOR(S) : Michael D. Ruehle It is certified that error appears in the above-identified patent and that said Letters Patent is hereby corrected as shown below:

Line 29, please delete "210," and insert therefore, --210.--.

Line 36, please delete "230," and insert therefore, --230.--.

Line 50, please delete "212," and insert therefore, --212.--.

Line 53, please delete "212," and insert therefore, --212.--.

Line 65, please delete "130," and insert therefore, --130.--.

Column 12

Line 2, please delete "230," and insert therefore, --230.--.

Line 6, please delete "240," and insert therefore, --240.--.

Line 17, please delete "W[19:12]." and insert therefore, --"$W$[19:12]."--.

Line 21, please delete "134," and insert therefore, --134.--.

Line 36, please delete "210," and insert therefore, --210.--.

Line 43, please delete "212," and insert therefore, --212.--.

Line 46, please delete "210," and insert therefore, --210.--.

Line 49, please delete "210," and insert therefore, --210.--.

Line 55, please delete "0," and insert therefore, --0.--.

Column 13

Line 3, please delete "210," and insert therefore, --210.--.

Line 18 (Approx.), please delete "310," and insert therefore, --310.--.

Line 30 (Approx.), please delete "210," and insert therefore, --210.--.

UNITED STATES PATENT AND TRADEMARK OFFICE
CERTIFICATE OF CORRECTION

| | | |
|---|---|---|
| PATENT NO. | : 7,283,591 B2 | |
| APPLICATION NO. | : 10/637953 | |
| DATED | : October 16, 2007 | |
| INVENTOR(S) | : Michael D. Ruehle | |

It is certified that error appears in the above-identified patent and that said Letters Patent is hereby corrected as shown below:

Line 38, please delete "210," and insert therefore, --210.--.

Line 48, please delete "310," and insert therefore, --310.--.

Line 51, please delete "310," and insert therefore, --310.--.

Line 52, please delete "210," and insert therefore, --210.--.

Line 55, please delete "110," and insert therefore, --110.--.

Line 64, please delete "110," and insert therefore, --110.--.

Column 14

Line 17, please delete "210," and insert therefore, --210.--.

Line 34, please delete "210," and insert therefore, --210.--.

Line 37, please delete "210," and insert therefore, --210.--.

Line 57, please delete "210," and insert therefore, --210.--.

Column 15

Line 2, please delete "210," and insert therefore, --210--.

Line 9, please delete "310," and insert therefore, --310.--.

Line 10, please delete "310," and insert therefore, --310.--.

Line 13, please delete "10," and insert therefore, --110--.

Line 19, please delete "220," and insert therefore, --220.--.

Line 21, please delete "2-4," and insert therefore, --2-4.--.

Line 22, please delete "510," and insert therefore, --510.--.

UNITED STATES PATENT AND TRADEMARK OFFICE
CERTIFICATE OF CORRECTION

PATENT NO.       : 7,283,591 B2
APPLICATION NO.  : 10/637953
DATED            : October 16, 2007
INVENTOR(S)      : Michael D. Ruehle It is certified that error appears in the above-identified patent and that said Letters Patent is hereby corrected as shown below:

Line 25, please delete "310," and insert therefore, --310.--.

Line 30, please delete "515," and insert therefore, --515.--.

Line 33, please delete "210," and insert therefore, --210.--.

Line 35, please delete "310," and insert therefore, --310.--.

Line 41, please delete "310," and insert therefore, --310.--.

Line 44, please delete "110," and insert therefore, --110.--.

Line 55, please delete "515," and insert therefore, --515.--.

Line 60, please delete "210," and insert therefore, --210.--.

Line 63, please delete "210," and insert therefore, --210.--.

Line 65, please delete "210," and insert therefore, --210.--.

Column 16

Line 2, please delete "210," and insert therefore, --210.--.

Line 6, please delete "210," and insert therefore, --210.--.

Line 8, please delete "210," and insert therefore, --210.--.

Line 10, please delete "210," and insert therefore, --210.--.

Line 16, please delete "520," and insert therefore, --520.--.

Line 27, please delete "510," and insert therefore, --510.--.

Line 36, please delete "210," and insert therefore, --210.--.

Line 40, please delete "520," and insert therefore, --520.--.

Line 53, please delete "114," and insert therefore, --114.--.

UNITED STATES PATENT AND TRADEMARK OFFICE
CERTIFICATE OF CORRECTION

PATENT NO. : 7,283,591 B2
APPLICATION NO. : 10/637953
DATED : October 16, 2007
INVENTOR(S) : Michael D. Ruehle It is certified that error appears in the above-identified patent and that said Letters Patent is hereby corrected as shown below:

Column 17

Line 67, please delete "11," and insert therefore, --11.--.

Column 18

Line 7, please delete "210," and insert therefore, --210.--.

Line 15 (Approx.), please delete "(210a)" and insert therefore, --(210A)--.

Line 16 (Approx.), please delete "(210b)" and insert therefore, --(210B)--.

Line 17 (Approx.), please delete "(210c)" and insert therefore, --(210C)--.

Line 18 (Approx.), please delete "(210d)" and insert therefore, --(210D)--.

Line 19 (Approx.), please delete "(210e)" and insert therefore, --(210E)--.

Line 31, please delete "210," and insert therefore, --210--.

Line 36, please delete "210," and insert therefore, --210--.

Line 55 (Approx.), please delete "210," and insert therefore, --210--.

Column 19

Line 17 (Approx.), please delete "210," and insert therefore, --210--.

Line 40, please delete "210," and insert therefore, --210--.

Line 50, after "210D," please add --and--.

Column 20

Line 6 (Approx.), please delete "130," and insert therefore, --130--.

Line 41, please delete "210," and insert therefore, --210--.

UNITED STATES PATENT AND TRADEMARK OFFICE
CERTIFICATE OF CORRECTION

PATENT NO. : 7,283,591 B2
APPLICATION NO. : 10/637953
DATED : October 16, 2007
INVENTOR(S) : Michael D. Ruehle It is certified that error appears in the above-identified patent and that said Letters Patent is hereby corrected as shown below:

<u>Column 21</u>

Line 49, please delete "310," and insert therefore, --310--.

<u>Column 22</u>

Line 5, please delete "310," and insert therefore, --310--.

Line 18, please delete "210," and insert therefore, --210--.

Line 21, please delete "210b," and insert therefore, --210B--.

Line 63, after "value" please add --.--.

<u>Column 23</u>

Line 30, please delete "5-8," and insert therefore, --5-8--.

Line 34, please delete "210," and insert therefore, --210--.

Line 40, please delete "5-8," and insert therefore, --5-8--.

<u>Column 24</u>

Line 19, please delete "310," and insert therefore, --310--.

Line 28, please delete "220," and insert therefore, --220--.

Line 32, please delete "210," and insert therefore, --210--.

Line 35, please delete "130," and insert therefore, --130--.

Line 50, please delete "210," and insert therefore, --210--.

Line 52, please delete "210," and insert therefore, --210--.

Line 58, please delete "210," and insert therefore, --210.--.

UNITED STATES PATENT AND TRADEMARK OFFICE
CERTIFICATE OF CORRECTION

| | |
|---|---|
| PATENT NO. | : 7,283,591 B2 |
| APPLICATION NO. | : 10/637953 |
| DATED | : October 16, 2007 |
| INVENTOR(S) | : Michael D. Ruehle |

It is certified that error appears in the above-identified patent and that said Letters Patent is hereby corrected as shown below:

<u>Column 25</u>

Line 9, please delete "114," and insert therefore, --114.--.

Line 15, please delete "210," and insert therefore, --210.--.

Line 24, please delete "520," and insert therefore, --520.--.

Line 28, please delete "210," and insert therefore, --210.--.

<u>Column 26</u>

Line 36, please delete "110," and insert therefore, --110.--.

Line 46, please delete "114," and insert therefore, --114.--.

Signed and Sealed this

Seventeenth Day of June, 2008

JON W. DUDAS
*Director of the United States Patent and Trademark Office*